United States Patent [19]

Hasegawa et al.

[11] Patent Number: 5,686,868
[45] Date of Patent: Nov. 11, 1997

[54] SEMICONDUCTOR INTEGRATED CIRCUIT HAVING VCO COUPLED THROUGH CAPACITANCE AND BUFFER CIRCUITS

[75] Inventors: Kouichi Hasegawa; Kazuyuki Yuda, both of Tokyo, Japan

[73] Assignee: Mitsubishi Denki Kabushiki Kaisha, Tokyo, Japan

[21] Appl. No.: 564,429

[22] Filed: Nov. 29, 1995

[30] Foreign Application Priority Data

Jun. 29, 1995 [JP] Japan ................................ 7-163867

[51] Int. Cl.$^6$ ........................................ H03B 1/00
[52] U.S. Cl. ........................ 331/75; 331/8; 331/108 C
[58] Field of Search ............................. 331/8, 25, 74, 331/75, 108 C, 108 D

[56] References Cited

U.S. PATENT DOCUMENTS

| | | | |
|---|---|---|---|
| 3,886,458 | 5/1975 | Matsumoto et al. | 330/307 |
| 4,622,681 | 11/1986 | Snell et al. | 375/48 |

FOREIGN PATENT DOCUMENTS

| | | |
|---|---|---|
| 2-193416 | 7/1990 | Japan. |
| 3-48526 | 3/1991 | Japan. |
| 6-216769 | 8/1994 | Japan. |

*Primary Examiner*—Siegfried H. Grimm
*Attorney, Agent, or Firm*—Leydig, Voit & Mayer

[57] ABSTRACT

A semiconductor IC used for synthesizer having a phase locked loop PLL, a voltage controlled oscillator (VCO) and a mixer (MIX) for intermediate frequency is formed on a one chip silicon wafer. A semiconductor IC used for synthesizer having a VCO portion and an internal circuit such as PLL on a silicon wafer chip includes a differential buffer circuit which separates the VCO portion from the internal circuit. A capacitor (C1) is connected to an output of the VCO portion. A constant voltage source (V1) may be connected to respective input of the differential transistors (Q4, Q5). Transistors (Q6,Q7) provide emitter follower output circuits in the differential buffer. Respective emitters of the transistors (Q6,Q7) are connected to corresponding constant current sources (I1,I2).

30 Claims, 21 Drawing Sheets

SEMICONDUCTOR INTEGRATED CIRCUIT HAVING VCO COUPLED THROUGH CAPACITANCE AND BUFFER CIRCUITS

BACKGROUND OF THE INVENTION

1. Field of the Invention

This invention relates to a semiconductor integrated circuit (IC) for a synthesizer which comprises a phase locked loop (PLL), a voltage controlled oscillator (VCO) including a high frequency analog circuit, and a frequency mixer (MIX) for intermediate frequency. The VCO, the PLL and MIX are formed on one silicon wafer chip.

2. Description of the Related Art

A semiconductor IC used for a synthesizer in the present invention is used for selecting only a necessary wave from many waves used in mobile communication systems. A conventional general frequency synthesizer system includes a PLL for carrying out frequency selection control, a VCO including individual semiconductors forming a local oscillator, and a MIX for mixing a reception signal with a frequency from the VCO. In the past, these three devices were formed on separate chips, respectively. However, forming those VCO, MIX and PLL on the same chip makes it possible to reduce the size and lower the price of the synthesizer.

FIG. 19 shows a conventional synthesizer system formed by interconnecting a VCO, an MIX and a PLL, which are formed on separated substrates. However, if the synthesizer system is comprised of multiple separate parts, the synthesizer system becomes too large to accommodate modern devices such as mobile cellular phones, etc. To solve this problem, a trial has been done to form a chip comprising VCO and PLL, etc., on the same substrate.

However, as is shown in FIG. 18, if these VCO, MIX and PLL are formed on the same substrate, mutual interferences occur between VCO and an internal circuit (PLL, MIX). Accordingly, it is necessary to satisfy the following requirements in order to form a synthesizer which operates at a high frequency on one chip:

(1) whether isolation of each element is sufficient to reduce interference;

(2) whether the desired S/N of VCO is guaranteed.

To consider the problems, a circuit configuration of a conventional synthesizer is taken as an example below. FIG. 21 shows a conventional circuit configuration which comprises a VCO portion and an internal circuit such as PLL formed on the same substrate. In FIG. 21, an IC chip 100 includes a VCO portion 1, a single buffer 2, and an internal circuit 3, such as a PLL. The VCO portion 1 comprises transistor Q1 for oscillation and a bias resistor. Single buffer 2 includes a buffer transistor Q8 and an emitter resistor R2 of transistor Q8. A capacitor C2 of several pF connects single buffer 2 with internal circuit 3. In FIG. 21, the frequency signal oscillated in transistor Q1 is transferred to the internal circuit 3, such as a PLL, via the single buffer 2 comprised of transistor Q8 and capacitor C2.

The emitter current of transistor Q8 depends on power supply voltage $V_{CC1}$. Therefore, when a signal oscillated in transistor Q1 is inputted to transistor Q8, if the DC potential of transistor Q1 varies, the emitter current of transistor Q8 varies slightly accordingly. This gives influence to the emitter of transistor Q1 and deteriorates VCO characteristics of transistor Q1.

Operation of the device depicted in FIG. 21 is explained in detail. Assuming that the respective base-emitter forward voltages of transistors Q1 and Q8 are $V_{BE}$, emitter current $I_{e2}$ of transistor Q8 is represented by the following formula:

$$I_{e2}=(V_{CC1}-2V_{BE})/R2$$

where, base potential $V_{B1}$ of transistor Q1 is almost equal to $V_{CC1}$.

As is known from this formula, emitter current $I_{e2}$ of transistor Q8 varies depending on power supply voltage $V_{CC1}$. Since the emitter of oscillation transistor Q1 and the base of buffer transistor Q8 are connected directly with each other, variation of power supply voltage of transistor Q1 causes $I_{e2}$ of transistor Q8 to vary. Thereby a zero potential of the oscillation frequency signal varies, which gives an influence to C/N ratio as well as S/N ratio of the signal oscillated by the transistor Q1.

Further, a high frequency signal from a divider circuit in internal circuit 3, such as PLL, affects transistor Q1 via capacitor C2 and transistor Q8, which changes oscillation frequency characteristics. In other words, the PLL includes a frequency divider (prescaler) and this frequency divider generates high frequency signals (spurious signals). The high frequency signals (spurious) are fed back from PLL and are applied to an emitter of oscillation transistor Q1 via capacitor C2 and the emitter and base of transistor Q8. In such a case, the potential of the emitter side of transistor Q1 varies and then VCO characteristics vary, which deteriorates S/N and C/N characteristics.

The following is an explanation of an example for connecting a VCO portion formed on a substrate to an internal circuit on the same substrate. FIG. 20 illustrates another conventional circuit configuration which comprises a VCO portion and other internal circuits such as PLL and MIX formed on a single substrate. In FIG. 20, VCO portion 1 includes an oscillation transistor Q1 and transistors Q2, Q3. The bases of each transistor are connected to $V_{CC1}$ via resistor r, while the emitter of transistor Q3 is grounded via resistor R2. Transistor Q1 is directly participating in oscillation. The signal generated in VCO portion 1 is outputted to internal circuit 3 from the emitter of transistor Q3.

In the case of a circuit configuration where a signal is outputted directly to an internal circuit from transistor Q3 such as FIG. 20, high frequency signal components generated in internal circuit 3 cause distortion or swinging to a wave of the emitter side of transistor Q3, which changes DC potential of emitter of transistor Q3. Thus, the base current of transistor Q3 causes distortion or swinging in its waveform as well.

Further, since the bases of respective transistors Q1, Q2, Q3 are commonly connected, a waveform of transistor Q3 directly affects oscillation transistor Q1. On this account, a deterioration is caused on the oscillation frequency characteristics (C/N, S/N).

It is an object of the present invention to provide a semiconductor IC used for a synthesizer which reduces spurious high frequency signals generated at an internal circuit by means of a capacitor and/or a resistor provided between the VCO portion and a differential buffer.

It is another object of the present invention to provide a semiconductor IC used for a synthesizer which reduces spurious high frequency signals generated at an internal circuit by means of a capacitor and/or a resistor provided between VCO portion and a single buffer.

It is a further object of the present invention to provide a semiconductor IC used for a synthesizer which reduces spurious high frequency signals generated at an internal circuit by means of a capacitor and/or a resistor provided between VCO portion and a single buffer and also between a single buffer and an internal circuit.

It is still a further object of the present invention to provide a semiconductor IC used for a synthesizer which reduces spurious high frequency signals generated at an internal circuit by means of a capacitor and/or a resistor provided between VCO portion and a single buffer, between the single buffer and a differential buffer and also between the differential buffer and an internal circuit.

SUMMARY OF THE INVENTION

According to one aspect of the invention, a semiconductor IC used for a synthesizer having a VCO portion and an internal circuit such as PLL on a silicon wafer chip comprises a capacitor (C1) for cutting off direct current between the VCO portion and the internal circuit.

According to another aspect of the invention, a semiconductor IC used for a synthesizer includes a VCO portion and an internal circuit such as PLL on a silicon wafer chip and further includes a differential buffer circuit for separating the VCO portion from the internal circuit, and a capacitor (C1) is connected to an input of the differential buffer circuit. A constant voltage V1 is also connected to the input of the differential buffer circuit.

According to a further aspect of the invention, a semiconductor IC used for a synthesizer having a VCO portion and an internal circuit such as PLL on a silicon wafer chip comprises a differential buffer circuit for separating the VCO portion from the internal circuit and a series circuit of a resistor (R6) and a capacitor (C1), one end of which is connected to an output of the VCO portion, the other end of which and a constant voltage (V1) are connected to an input of the differential buffer circuit.

According to a further aspect of the invention, a semiconductor IC used for a synthesizer having a VCO portion, a single buffer, and an internal circuit such as PLL on a silicon wafer chip comprises a series circuit of a first capacitor (C1) and a resistor (R6) for cutting off direct current between the VCO portion and the single buffer; and a second capacitor (C2) for cutting Off direct current between the single buffer and the internal circuit.

According to a further aspect of the invention, a semiconductor IC used for a synthesizer having a VCO portion, a single buffer, and an internal circuit such as PLL on a silicon wafer chip comprises a series circuit of a first capacitor (C1) and a resistor (R6) for separating the VCO portion from the single buffer; and a series circuit of a second capacitor (C2) and a resistor (RT) for separating the single buffer from the internal circuit.

Preferably, the differential buffer includes a differential amplifier having first and second transistors (Q4, Q5) and emitter follower output circuits (Q6, Q7). The first transistor (Q4) of the differential amplifier is coupled with VCO portion (1), a bias potential (V1) is applied to respective bases of the first and the second transistors (Q4, Q5), respective collectors of the first and second transistors are connected to corresponding bases of a third and a fourth transistors (Q6, Q7), and respective emitters of the third and fourth transistors are connected to corresponding constant current sources (I1, I2).

Further, preferably, a power supply of the VCO portion and a power supply of the differential buffer circuit are separated.

Further, preferably, the single buffer includes a buffer transistor (QS), wherein a base of the buffer transistor (Q8) is connected to a power supply via a constant current source (I) and also grounded via a plurality of diodes, and an emitter of the buffer transistor (QS) is grounded via a resistor (R2).

Further, preferably, the single buffer comprises a buffer transistor (QS), wherein a base of the buffer transistor (Q8) is connected to a power supply via a constant current source (I) and also grounded via a series circuit of a plurality of diodes and a resistor (RS), and an emitter of the buffer transistor (QS) is grounded via a resistor (R2).

Further, preferably, the single buffer comprises a buffer transistor (QS), wherein a base of the buffer transistor (QS) is connected to a power supply via a resistor $R_B$, and an emitter of the buffer transistor (Q8) is grounded via a constant current source (I).

Further, preferably, the single buffer comprises a buffer transistor (QS), wherein a base of the buffer transistor (QS) is connected to a constant voltage source (V1), and an emitter of the buffer transistor (Q8) is grounded via a constant current source (I).

Further, preferably, the single buffer comprises a buffer transistor (QS), wherein a constant voltage source (V1) is connected to a node of a first capacitor (C1) and a resistor (R6), and an emitter of the buffer transistor (QS) is grounded via a constant current source (I).

DETAILED DESCRIPTION OF THE PREFERRED EMBODIMENTS

Embodiment 1

Figure 1:
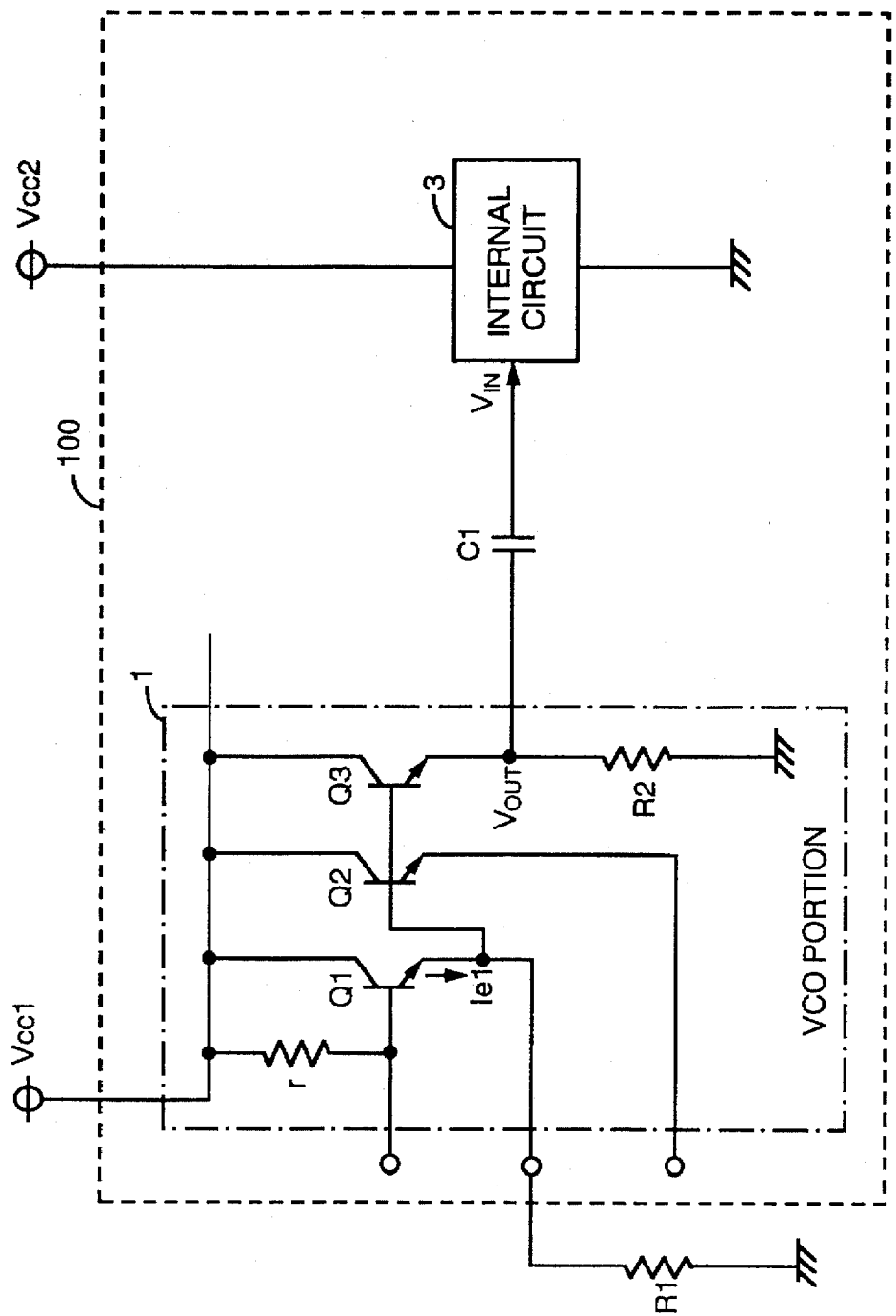
FIG. 1 shows a circuit configuration of a semiconductor IC used for a synthesizer comprising an isolation circuit according to a first embodiment of the invention.

FIG. 1 shows a circuit configuration of a semiconductor IC used for a synthesizer comprising an isolation circuit according to a first embodiment of the invention. The semiconductor IC of FIG. 1 comprises a capacitor C1 which is inserted between VCO portion 1 and internal circuit 3 which are formed on the same substrate. DC signal from VCO portion 1 is cut off by capacitor C1. In FIG. 1, an IC chip 100 comprises a VCO portion and an internal circuit 3 such as MIX and PLL including a prescaler. Power supply voltage $V_{CC1}$ is applied to VCO portion 1, while power supply voltage $V_{CC2}$ is applied to the internal circuit 3. VCO portion 1 comprises oscillation transistor Q1 and transistors Q2, Q3. An emitter of transistor Q1 is connected to the bases of transistors Q2, Q3. A base of transistor Q1 is connected to $V_{CC1}$ via resistor r. An emitter of transistor Q3 is grounded via resistor R2. The signal oscillated in transistor Q1 is transferred from the emitter of transistor Q1 to the base of transistor Q2 and further to the base of transistor Q3, and then outputted from the emitter of transistor Q3.

In FIG. 1, by adding a capacitor C1 to the conventional circuit, it is possible to reduce the influence of spurious high frequency signals generated in internal circuit 3 may have on DC components of the current flowing through the emitter of transistor Q1. Therefore, it is possible to decrease the influence that the spurious high frequency signals generated in internal circuit 3 have on VCO portion 1. The above explanation is shown by the following formula:

$$v_{OUT}=R2(R2+1/j\omega C1)\cdot V_{IN}$$

where, $V_{IN}$ is a spurious high frequency signal voltage generated in PLL circuit and $V_{OUT}$ is a voltage applied to the emitter of transistor Q3. As is known from this formula, capacitor C1 cuts off DC signals, and also reduces the influence that spurious high frequency signals transmitted from internal circuit 3 such as PLL have on the oscillation frequency.

Embodiment 2

Figure 2:
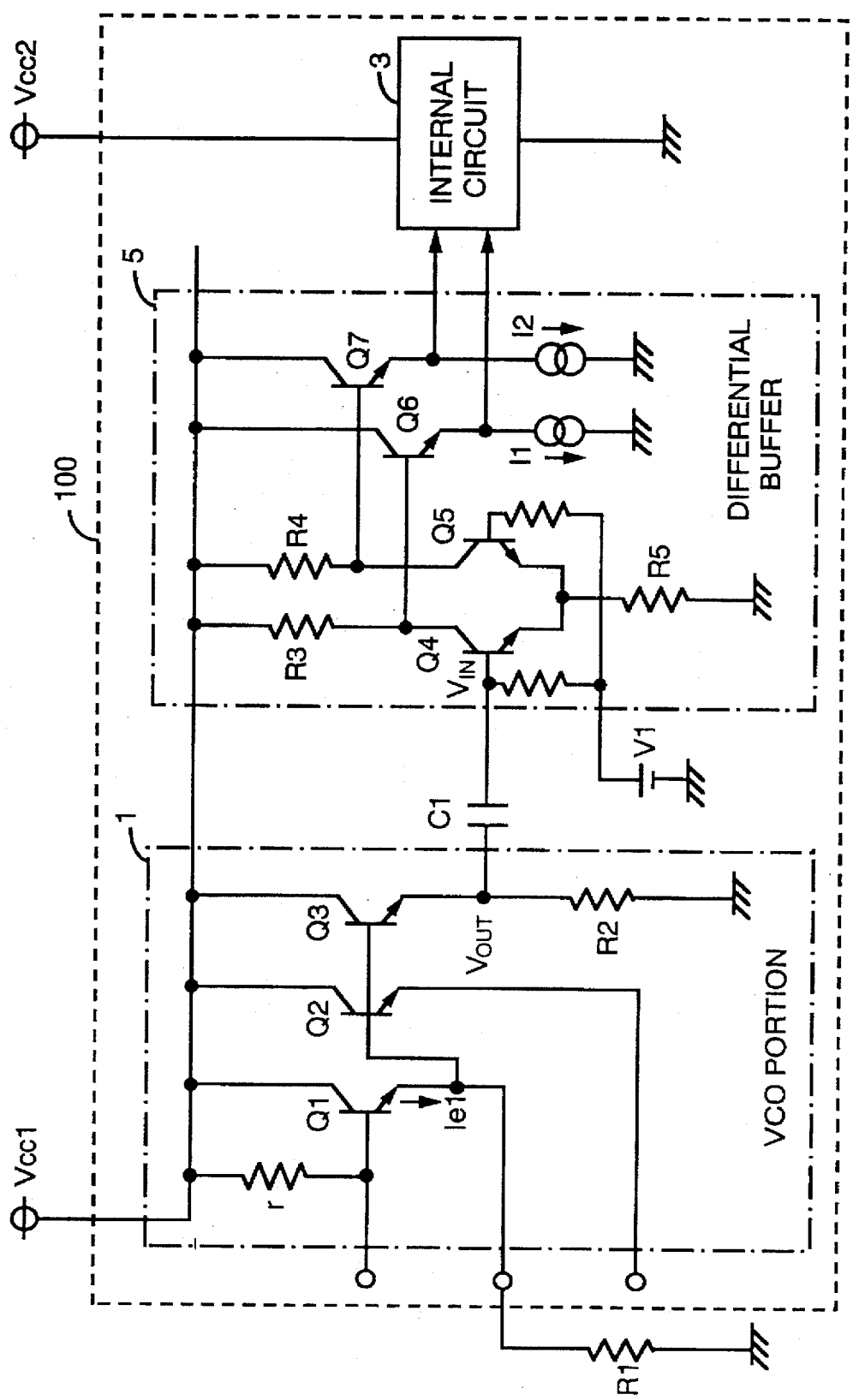
FIG. 2 shows a circuit configuration of a semiconductor IC used for a synthesizer comprising an isolation circuit according to a second embodiment of the invention.

FIG. 2 shows a circuit configuration of a semiconductor IC used for a synthesizer comprising an isolation circuit according to a second embodiment of the invention. In FIG. 2, an IC chip 100 comprises a VCO portion, a differential buffer 5 and an internal circuit 3 such as MIX and PLL including a prescaler. Power supply voltage $V_{CC1}$ is applied to VCO portion 1 and differential buffer 5, while power supply voltage $V_{CC2}$ is applied to the internal circuit 3. VCO portion 1 comprises oscillation transistor Q1 and transistors Q2, Q3. An emitter of transistor Q1 is connected to the bases of transistors Q2, Q3. A base of transistor Q1 is connected to $V_{CC1}$ via resistor r. An emitter of transistor Q3 is grounded via resistor R2. The signal oscillated in transistor Q1 is transferred from the emitter of transistor Q1 to the base of transistor Q2 and further to the base of transistor Q3, and then outputted from the emitter of transistor Q3.

Differential buffer 5 comprises a differential amplifier circuit and an emitter follower output circuit. Transistors Q4, Q5 comprise the differential amplifier circuit and bias potential (V1) is applied to a base of the first and the second transistors Q4, Q5. Resistors R3, R4 are connected between respective collectors of transistors Q4, Q5 and power supply $V_{CC1}$, respectively. Resistor R5 is connected between respective emitters of transistors Q4, Q5 and the earth.

Respective bases of transistors Q6, Q7 are connected to collectors of transistors Q4, Q5. Respective emitters of transistors Q6, Q7 are connected to corresponding constant current sources I1, I2. Transistors Q6, Q7 and constant current sources I1, I2 comprise an emitter follower output circuit for the respective differential amplifier circuit of differential amplifier buffer 5.

In FIG. 2, an isolation circuit comprises capacitor C1. One end of the capacitor C1 is connected to the emitter of transistor Q3 in VCO portion 1, while the other end is connected to the base of transistor Q4 in differential buffer 5. This capacitor C1 eliminates the DC component from oscillation signals from VCO portion 1 in differential buffer 5. A constant voltage source V1 gives bias potential to the respective bases of transistors Q4, Q5.

A DC component of a signal outputted from the emitter of transistor Q3 in VCO portion 1 is blocked by capacitor C1 and then the remaining signal is transferred to differential buffer 5. The signal received at differential buffer 5 is further outputted to a succeeding internal circuit 3 via the emitter follower output circuits of differential buffer 5.

When spurious high frequency noises are generated in PLL of internal circuit 3 which are directed for VCO portion 1, the DC components of the spurious high frequency noises are eliminated via capacitor C1 and differential buffer 5 which are located between VCO portion 1 and internal circuit 3. Therefore, the spurious high frequency components directly affect VCO portion 1 in this second embodiment. The high frequency components first give an effect to the output side of differential buffer 5, namely the emitters of transistors Q6, Q7 which comprise emitter follower output circuits. Since the input side of differential buffer 5 indicates high impedance, while the output side indicates low impedance, high frequency components inputted to the emitter of transistors Q6, Q7 from internal circuit 3 go through to the earth via constant current sources I1, I2. Accordingly, high frequency components from internal circuit 3 do not give an effect to VCO portion 1. In other words, differential buffer 5 itself operates as an isolation circuit.

Next, a case is explained in which the spurious high frequency components generated in internal circuit 3 skip differential buffer 5 and appear on the base of transistor Q4, in other words, spurious high frequency components exist between transistor Q4 and capacitor C1. Assume that an output impedance of transistor Q3 is high impedance in this case. If voltage of the high frequency components between transistor Q4 and capacitor C1 stands for $V_{IN}$ and voltage applied to the emitter of transistor Q3 stands for $V_{OUT}$, voltage of the high frequency components which cause influences to the emitter of transistor Q3 in VCO portion 1 via capacitor C1 is represented in the following formula.

$$V_{OUT} = \{R2/(R2+1/j\omega C1)\} \cdot V_{IN}$$

By taking the impedance value of $1/j\omega C1$ to be larger than the resistance value of resistor R2, it is further possible to attenuate the voltage applied to transistor Q3 in VCO portion 1. Accordingly, the bad influence given to VCO portion by the high frequency components is reduced.

Next, how the reduced high frequency components will affect the VCO portion 1 is considered. The high frequency components cause distortion or swinging in the emitter side waveform of transistor Q3 and they also cause DC level of the emitter potential of transistor Q3 to vary. Thereby, a waveform of the base current of transistor Q3 is effected by the distortion or swinging of the emitter current of transistor Q3. In the conventional circuit, since the base of oscillation transistor Q1 is commonly connected to the base of transistors Q2, Q3, the base potential of transistor Q3 directly influences the oscillation frequency characteristics of transistor Q1. However, according to this second embodiment, since the base of transistor Q1 is separated from the base of the oscillation transistors Q2, Q3 without being connected in common, the degree of influence which is directly given to the oscillation frequency characteristics of transistor Q1 by the base current of transistor Q3 becomes small.

By the above-mentioned circuit configuration, isolation of VCO portion 1 and that of internal circuit 3 are strengthened, which lessens deterioration of the oscillation frequency characteristics (C/N, S/N).

Embodiment 3

Figure 3:
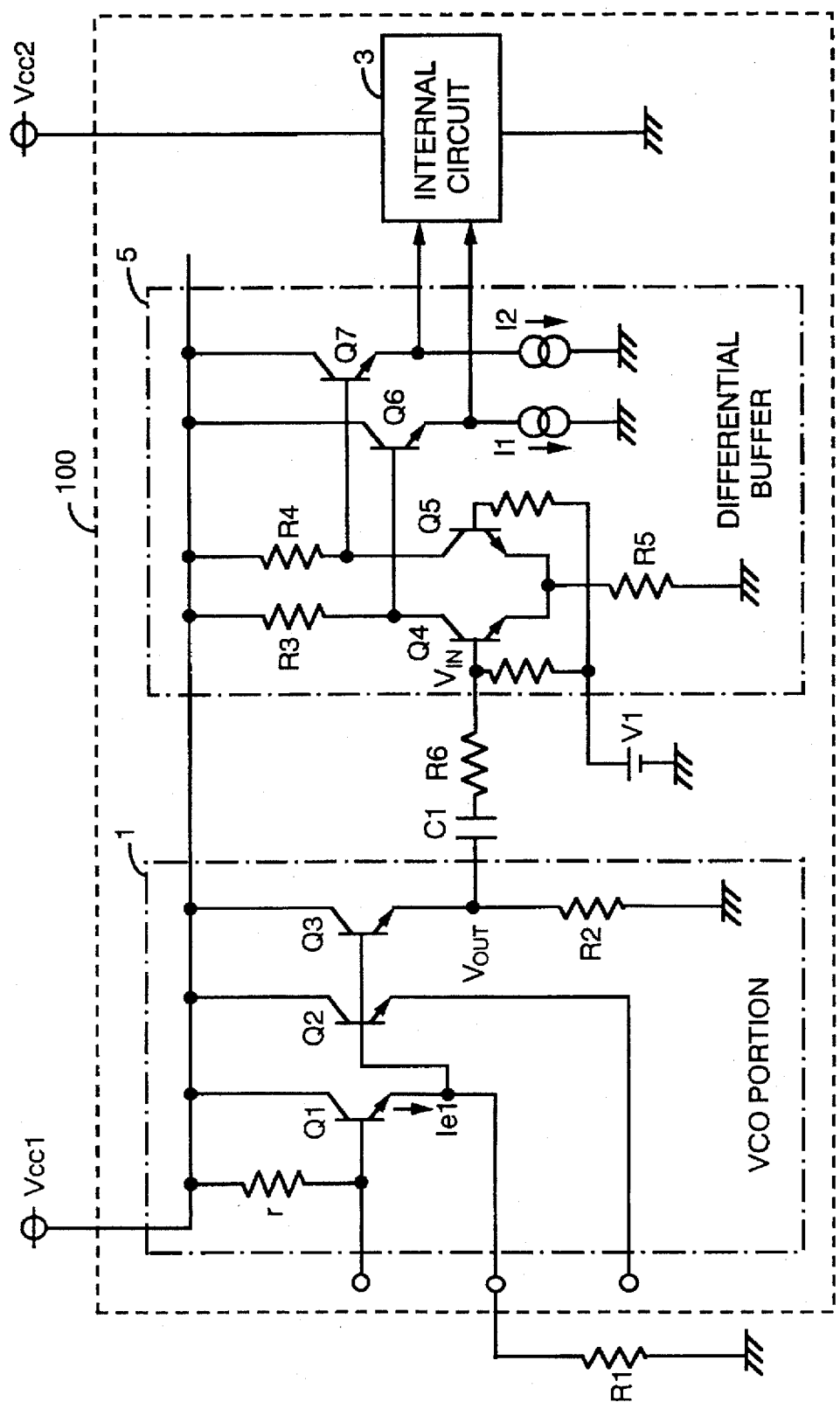
FIG. 3 shows a circuit configuration of a semiconductor IC used for a synthesizer comprising an isolation circuit according to a third embodiment of the invention.

FIG. 3 shows a circuit configuration of a semiconductor IC used for a synthesizer comprising an isolation circuit according to a third embodiment of the invention. The circuit configuration of the third embodiment further improves the invention explained in the second embodiment. The circuit configuration of the third embodiment has an advantage that a resistor R6 having an order of several tens~several hundreds Ω is inserted between capacitor C1 and differential buffer 5 in addition to the second embodiment. If voltage of the high frequency components at the input base terminal of transistor Q4 which are generated and transferred from internal circuit 3 stands for $V_{IN}$ and voltage applied to the emitter of transistor Q3 stands for $V_{OUT}$, voltage of the high frequency components which cause influences to the emitter of transistor Q3 in VCO portion 1 via capacitor C1 and resistor R6 is represented in the following formula.

$$V_{OUT} = \{R2/(R2+R6+1/j\omega C1)\} \cdot V_{IN}$$

By taking a sum of the impedance value $1/j\omega C1$ and the resistance value of resistor R2 to be larger than the resistance value of resistor R2, it is further possible to attenuate the voltage applied to transistor Q3 in VCO portion 1. Accordingly, the high spurious frequency components are more attenuated than that of the second embodiment, which lessens an effect on the VCO portion.

By the above-mentioned circuit configuration, isolation of VCO portion 1 and that of internal circuit 3 are further strengthened, which further stabilizes oscillation frequency characteristics (C/N, S/N) of transistor Q1.

Embodiment 4

Figure 4:
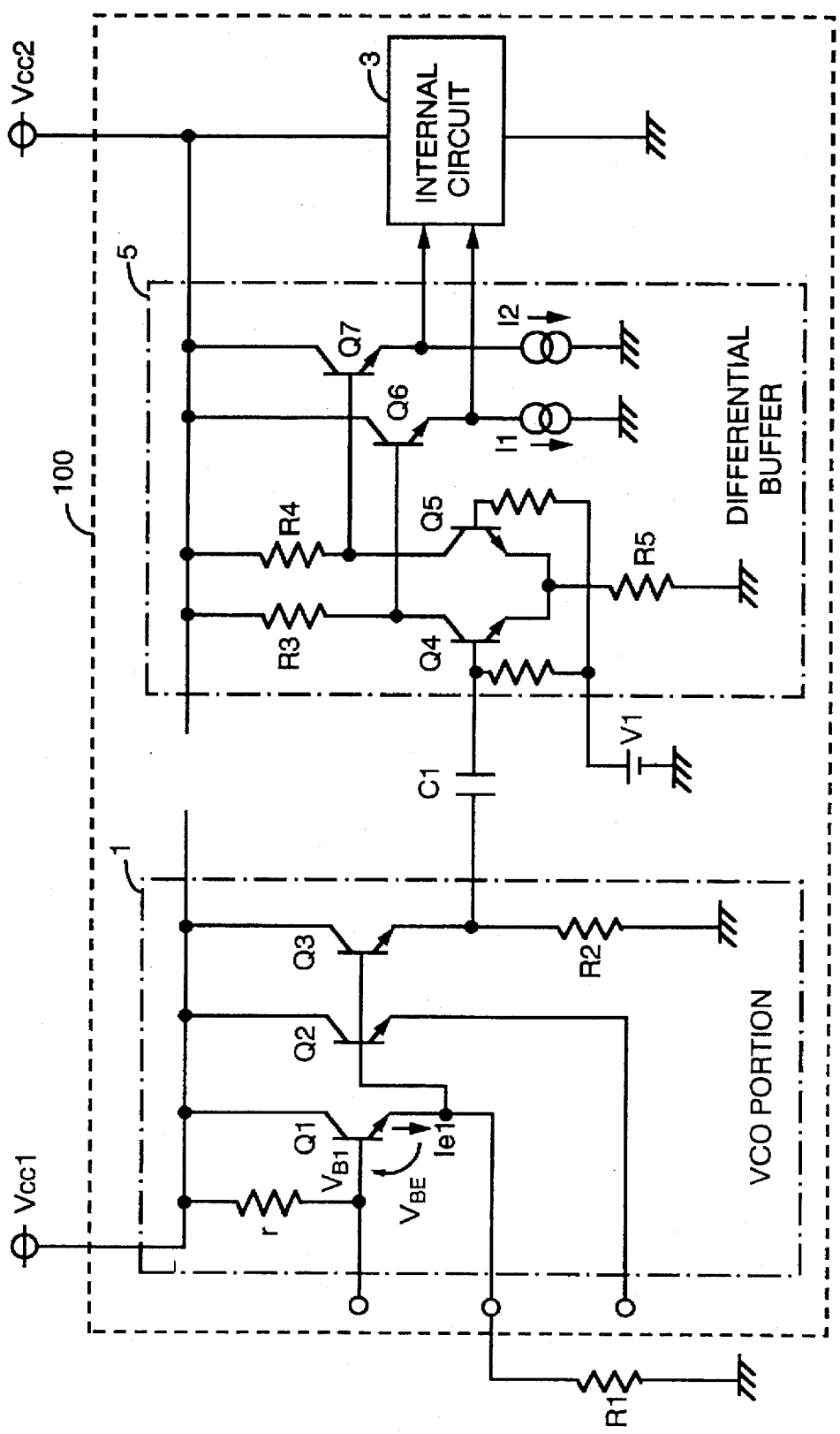
FIG. 4 shows a circuit configuration of a semiconductor IC used for a synthesizer comprising an isolation circuit according to a fourth embodiment of the invention.

FIG. 4 shows a circuit configuration of a semiconductor IC used for a synthesizer comprising an isolation circuit according to a fourth embodiment of the invention. The circuit configuration of the fourth embodiment has an advantage that the power supply for VCO portion 1 and that for differential buffer 5 in FIG. 1 are separated. That is, VCO portion 1 is supplied by power supply $V_{CC1}$, while differential buffer 5 and internal circuit 3 are commonly supplied by power supply $V_{CC2}$.

As mentioned above, by separating the power supply for VCO portion 1 and the power supply for differential buffer 5, noise generated in internal circuit 3 is prevented from turning around to VCO portion 1 via the power supply line.

When base-emitter forward voltage of oscillation transistor Q1 stands for $V_{BE}$, emitter current $I_{e1}$ of transistor Q1 is represented in the following formula:

$$I_{e1} = (V_{CC1} - V_{BE})/R1$$

where, the base potential $V_{B1}$ of transistor Q1 is substantially equal to $V_{CC1}$.

As is known from this formula, the emitter current $I_{e1}$ of transistor Q1 varies depending on the power supply voltage $V_{CC1}$. In case of the conventional example where power supply $V_{CC1}$ for VCO portion 1 and power supply $V_{CC2}$ for differential buffer 5 and internal circuit 3 are commonly connected, if power supply $V_{CC2}$ for differential buffer 5 and internal circuit 3 varies by some causes, the emitter current $I_{e1}$ of oscillation transistor Q1 varies, and, thereby, an oscillation frequency varies. In the fourth embodiment, since power supply $V_{CC1}$ for VCO portion 1 and power supply $V_{CC2}$ for differential buffer 5 and internal circuit 3 are separated, even if power supply $V_{CC2}$ for differential buffer 5 and internal circuit 3 varies by some causes, the oscillation frequency signal of oscillation transistor Q1 does not vary. Accordingly, isolation between differential buffer 5 and internal circuit 3, and oscillation transistor Q1 is strengthened. Further, oscillation frequency characteristics (C/N,S/N) of transistor Q1 are stabilized.

Embodiment 5

Figure 5:
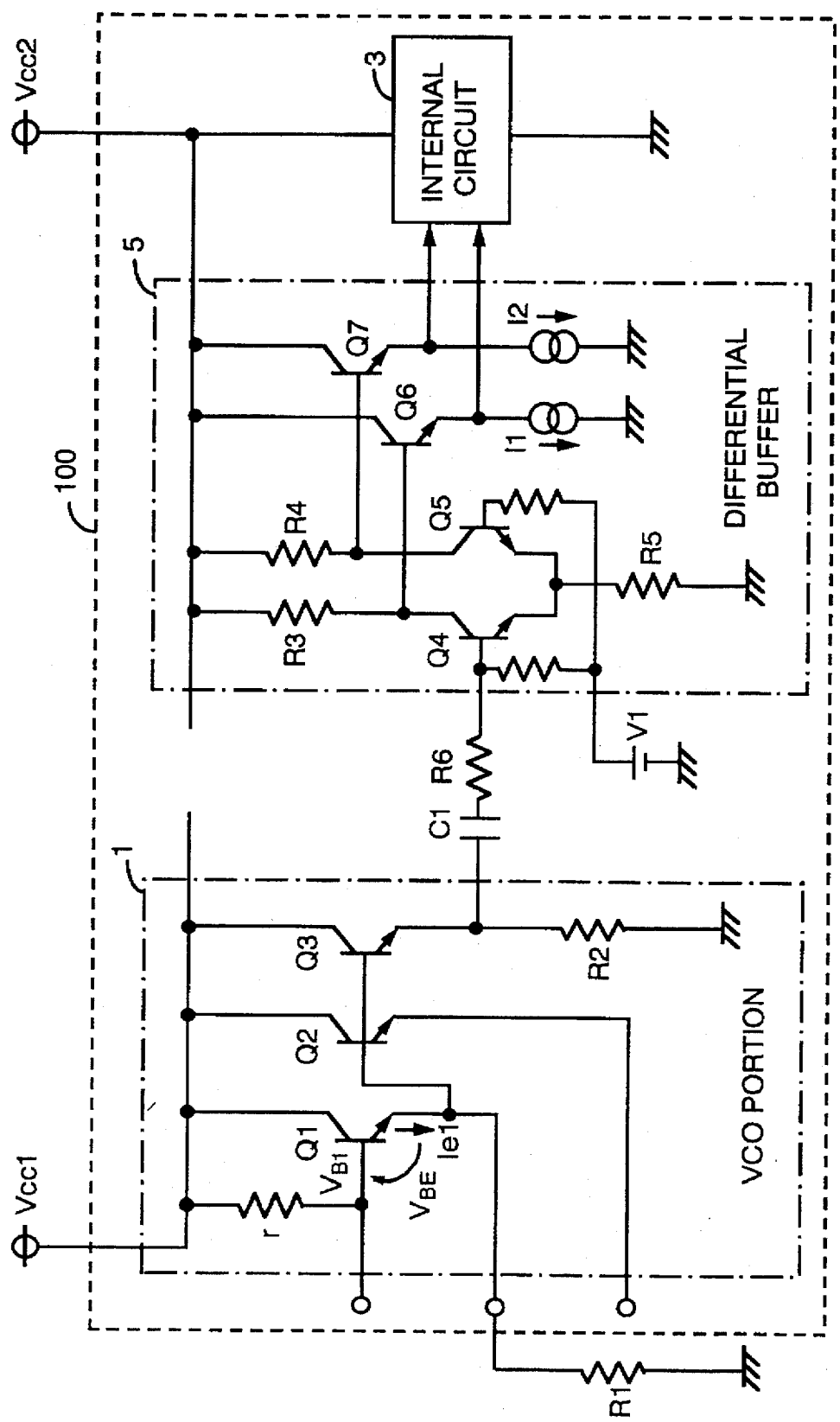
FIG. 5 shows a circuit configuration of a semiconductor IC used for a synthesizer comprising an isolation circuit according to a fifth embodiment of the invention.

FIG. 5 shows a circuit configuration of a semiconductor IC used for a synthesizer comprising an isolation circuit according to a fifth embodiment of the invention. The circuit configuration of the fifth embodiment has an advantage that the power supply for VCO portion 1 and that for differential buffer 5 in FIG. 2 are separated. That is, VCO portion 1 is supplied by power supply $V_{CC1}$, while differential buffer 5 and internal circuit 3 are commonly supplied by power supply $V_{CC2}$.

As mentioned above, by separating the power supply for VCO portion 1 and the power supply for differential buffer 5, noise generated in internal circuit 3 is prevented from reaching VCO portion 1 via the power supply line.

When base-emitter forward voltage of oscillation transistor Q1 is replaced by $V_{BE}$, emitter current $I_{e1}$ of transistor Q1 is represented by the following formula:

$$I_{e1} = (V_{CC1} - V_{BE})/R1$$

where, the base potential $V_{B1}$ of transistor Q1 is substantially equal to $V_{CC1}$.

As is known from this formula, the emitter current $I_{e1}$ of transistor Q1 varies depending on the power supply voltage $V_{CC1}$. In case of the conventional example where power supply $V_{CC1}$ for VCO portion 1 and power supply $V_{CC2}$ for differential buffer 5 and internal circuit 3 are commonly connected, if power supply $V_{CC2}$ for differential buffer 5 and internal circuit 3 varies by some causes, the emitter current $I_{ei}$ of oscillation transistor Q1 varies, and, thereby, an oscillation frequency varies. In the fifth embodiment, since power supply $V_{CC1}$ for VCO portion 1 and power supply $V_{CC2}$ for differential buffer 5 and internal circuit 3 are separated, even if power supply $V_{CC2}$ for differential buffer 5 and internal circuit 3 varies by some causes, the oscillation frequency signal of oscillation transistor Q1 does not vary. Accordingly, isolation between differential buffer 5 and internal circuit 3, and oscillation transistor Q1 is strengthened further, which further stabilizes oscillation frequency characteristics (C/N,S/N) of transistor Q1.

Embodiment 6

Figure 6:
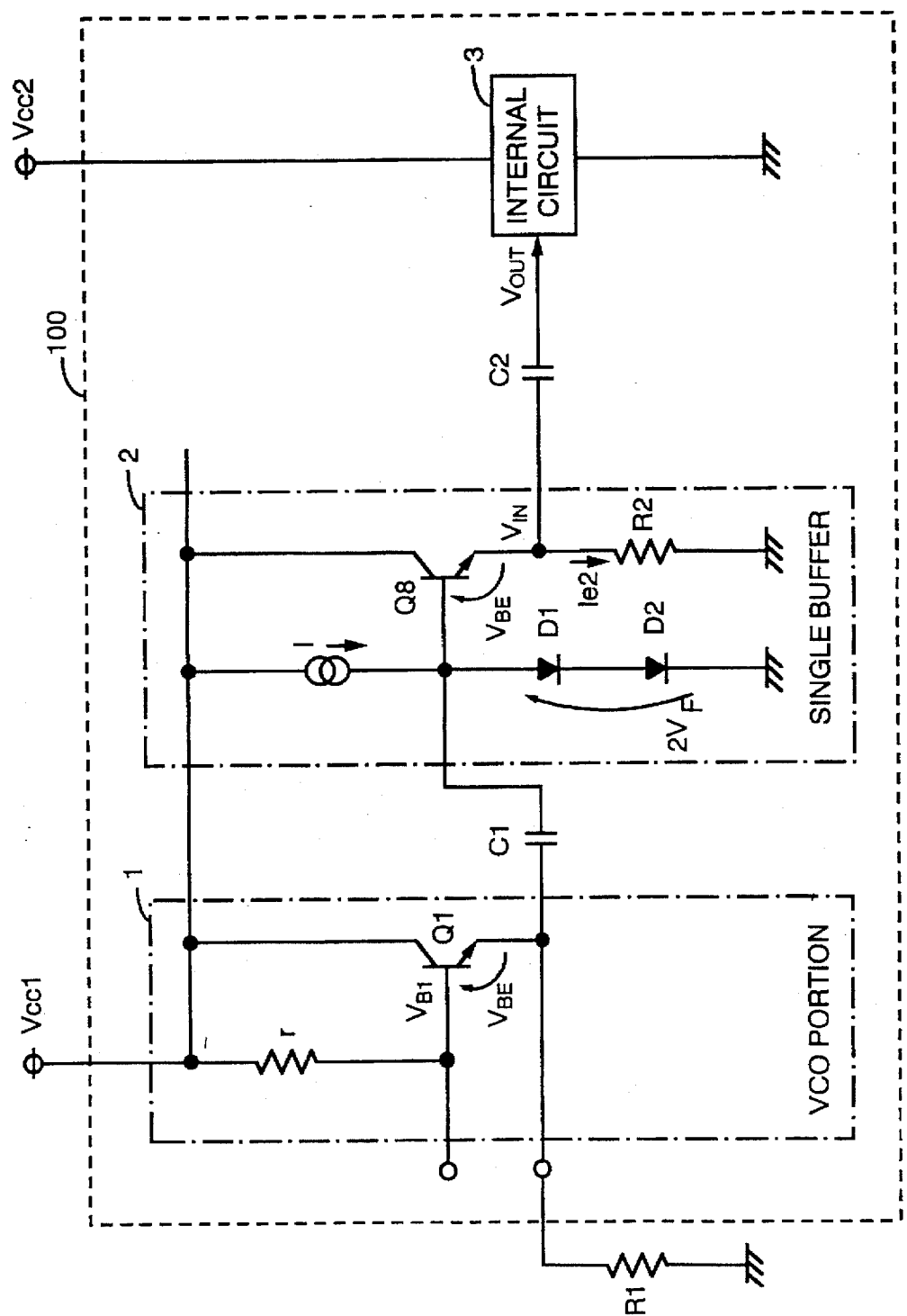
FIG. 6 shows a circuit configuration of a semiconductor IC used for a synthesizer comprising an isolation circuit according to a sixth embodiment of the invention.

FIG. 6 shows a circuit configuration of a semiconductor IC used for a synthesizer comprising an isolation circuit according to a sixth embodiment of the invention. In FIG. 6, an IC chip 100 comprises a VCO portion 1, a single buffer 2 and an internal circuit 3 such as MIX and PLL including a prescaler. The single buffer 2 separates VCO portion 1 from internal circuit 3. A capacitor C1 having a value of several pF cuts off direct current between transistor Q1 and transistor Q8. Diodes D1,D2 determine bias point of the base of transistor Q8.

An isolation operation of semiconductor IC used for a synthesizer shown in FIG. 6 is explained below. In FIG. 6, since current of a constant current source I flows through diodes D1,D2 and forward direction constant voltage $2V_F$ of diodes D1,D2 is applied to the base of transistor QS, base-emitter voltage $V_{BE}$ becomes constant. Accordingly, emitter current $I_{e2}$ of transistor Q8 is represented in the following formula:

$$I_{e2}=(2V_F-V_{BE})/R1$$

As is known from the formula, the emitter current $I_{e2}$ of transistor Q8 have no relation to power supply voltage $V_{CC1}$. In other words, the emitter current $I_{e2}$ of transistor Q8 is not affected by power supply voltage $V_{CC1}$. Further, in order to decrease variation of oscillation frequency caused by variation of base current $I_{b2}$ of transistor Q8 or caused by effect of the high frequency signal from internal circuit 3 such as PLL, capacitor C1 of several pF is inserted between oscillation transistor Q1 and buffer transistor Q8 to cut off direct current.

Further, in order to attenuate the spurious high frequency signals received from the internal circuit 3 such as PLL, capacitor C2 is connected between internal circuit 3 and single buffer 2. By connecting capacitor C2 in his way, it is possible to reduce the effect that the spurious high frequency signals generated in internal circuit 3 such as PLL have on the emitter of transistor Q8.

As mentioned above, constant voltage $2V_F$ made by constant current source I and a serial circuit of diodes D1, D2 are applied to the base of transistor Q8 and also capacitor C1 cuts off direct current between VCO portion 1 and single buffer 2. Therefore, voltage variation of the power supply has a minimal effect on variation of the oscillation frequency of VCO portion 1. Moreover, DC component of the high frequency signal received from internal circuit 3 such as PLL is cut off by capacitor C2 and also the high frequency signal is divided by capacitor C2 and resistor R2. Therefore, the high frequency signal received from internal circuit 3 has a minimal effect on the oscillation frequency. The above explanation is represented in the following formula:

$$V_{out}=R2/(R2+1/j\omega C2)\cdot V_{IN}$$

where, $V_{IN}$ stands for the high frequency signal voltage generated in PLL and $V_{OUT}$ stands for the voltage applied to the emitter of transistor Q8. As is known from this formula, by dividing the high frequency signal by capacitor C2 and resistor R2, the high frequency signal from internal circuit 3 such as PLL gives less influence to the oscillation frequency.

Figure 7:
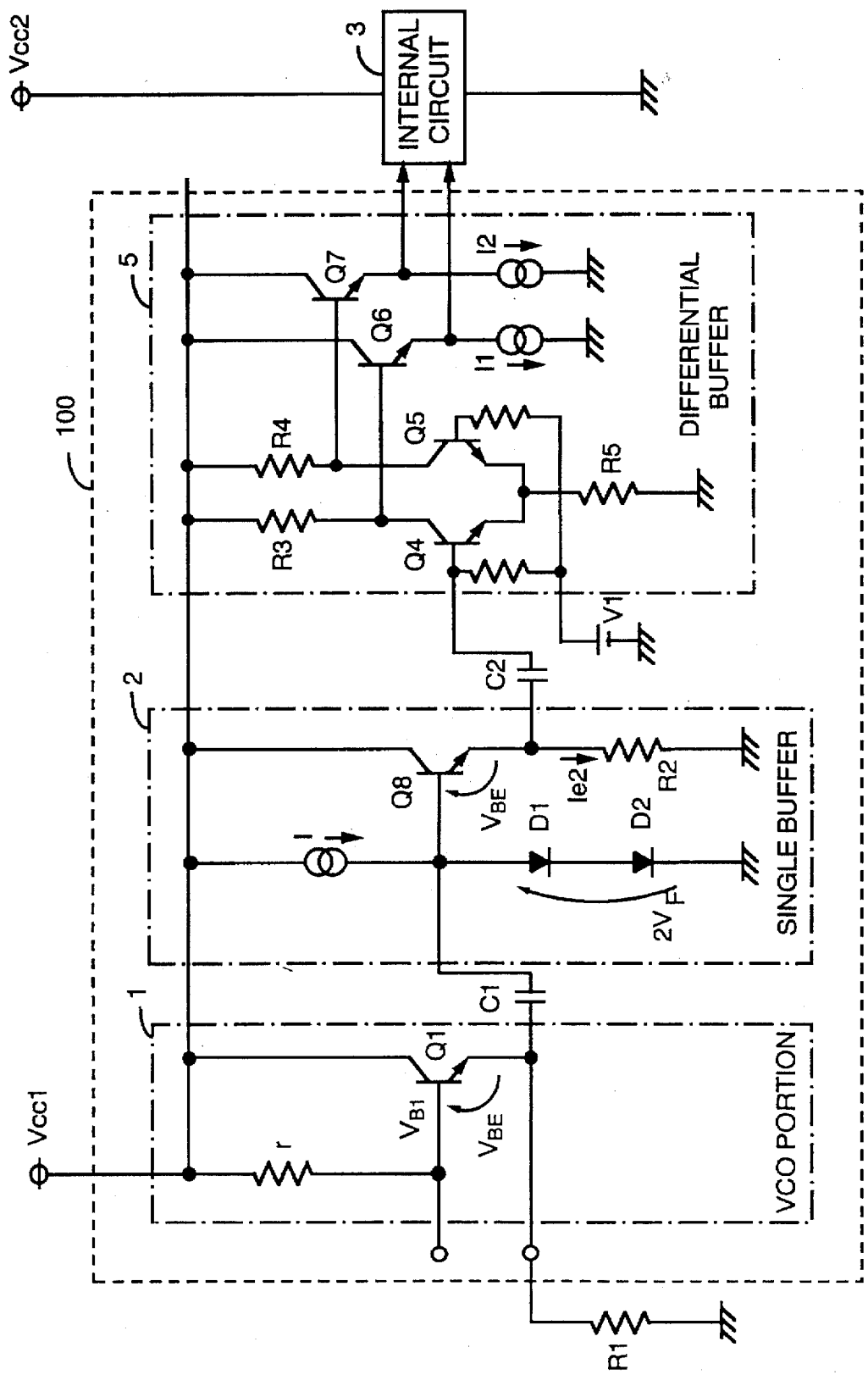
FIG. 7 shows another circuit configuration of a semiconductor IC used for a synthesizer comprising an isolation circuit according to a sixth embodiment of the invention.

FIG. 7 shows another circuit configuration of a semiconductor IC used for a synthesizer comprising an isolation circuit according to a sixth embodiment of the invention. In FIG. 7, an IC chip 100 comprises a VCO portion 1 and a single buffer 2. The single buffer 2 is an isolation circuit which separates VCO portion 1 from internal circuit 3. The circuit configuration of the sixth embodiment has an advantage that a differential buffer 5 is inserted between capacitor C2 and internal circuit 3 to strengthen the isolation between internal circuit 3 and VCO portion 1. Accordingly, in case of the circuit configuration of FIG. 7, the oscillation frequency is less affected by the high frequency signal from the internal circuit 3.

Embodiment 7

Figure 8:
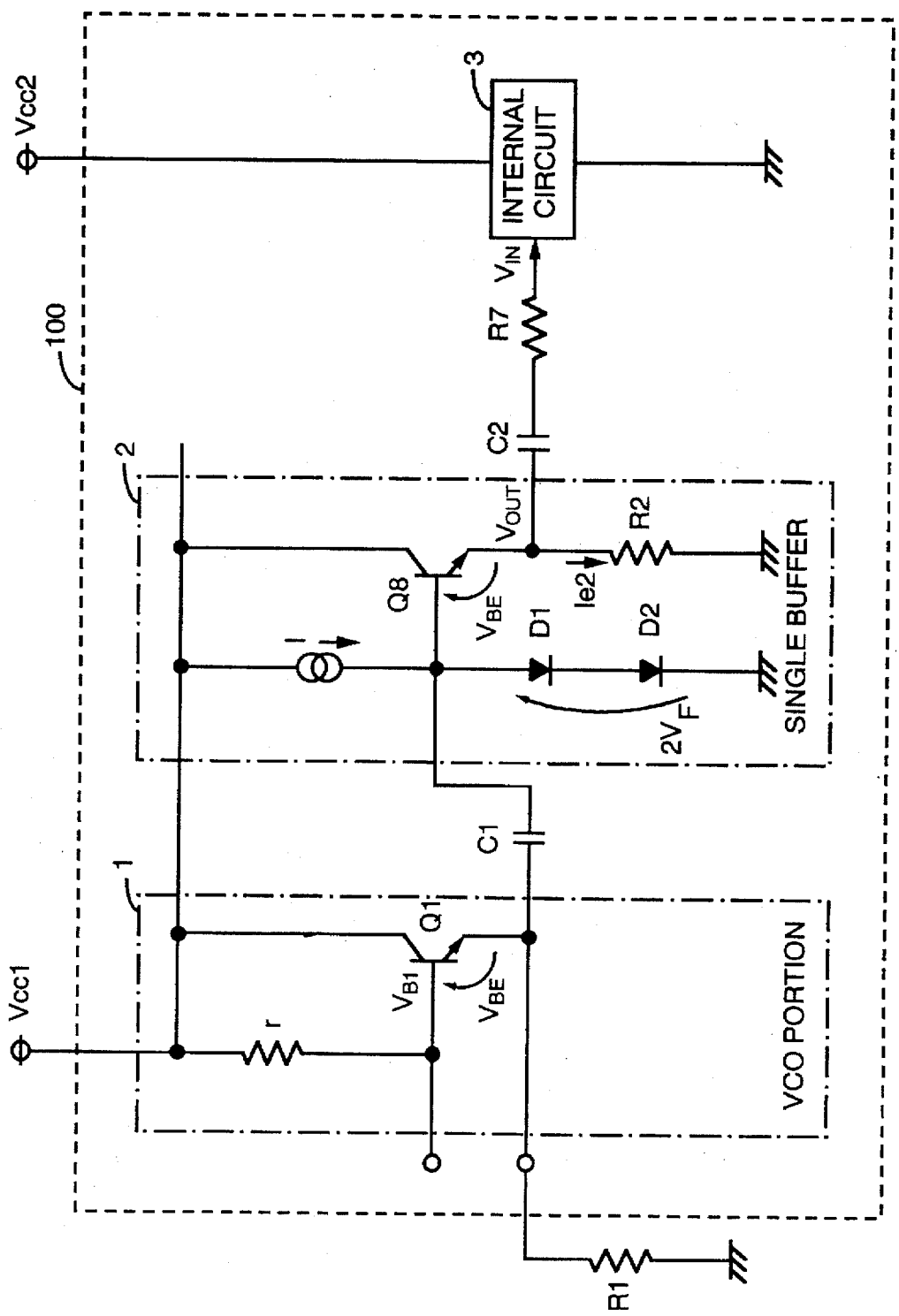
FIG. 8 shows a circuit configuration of a semiconductor IC used for a synthesizer comprising an isolation circuit according to a seventh embodiment of the invention.

FIG. 8 shows a circuit configuration of a semiconductor IC used for a synthesizer comprising an isolation circuit according to a sixth embodiment of the invention. In FIG. 8, an IC chip 100 comprises a VCO portion 1, a single buffer 2 and an internal circuit 3 such as MIX and PLL including prescaler. The single buffer 2 separates VCO portion 1 from internal circuit 3. A capacitor C1 having a value of several pF cuts off direct current between transistor Q1 and transistor Q8. Diodes D1,D2 determine bias point of the base of transistor Q8. Resistor R7 having resistance value of several tens Ω decreases the level of spurious high frequency signals.

An isolation operation of semiconductor IC used for a synthesizer shown in FIG. 8 is explained below. In FIG. 8, since current from a constant current source I flows through diodes D1, D2 and forward direction constant voltage $2V_F$ of diodes D1, D2 is applied to the base of transistor Q8, base-emitter voltage $V_{BE}$ of transistor Q8 becomes constant. Accordingly, emitter current $I_{e2}$ of transistor Q8 is represented in the following formula:

$$I_{e2}=(2V_F-V_{BE})/R2$$

As is known from the formula, the emitter current $I_{e2}$ of transistor Q8 has no relation to power supply voltage $V_{cc1}$. In other words, the emitter current $I_{e2}$ of transistor Q8 is not affected by power supply voltage $V_{CC1}$. Further, in order to decrease variation of oscillation frequency caused by variation of base current $I_{b2}$ of transistor Q8 or caused by the effect of the high frequency signal from internal circuit 3, capacitor C1 of several pF is inserted between oscillation transistor Q1 and buffer transistor Q8 to cut off direct current.

Further, in order to attenuate the spurious high frequency signals received from the internal circuit 3, a resistor R7 having value of several tens Ω is connected in series to capacitor C2 between internal circuit 3 and single buffer 2. By connecting resistor R7 and capacitor C2 in series, it is possible to reduce the effect that the spurious high frequency signals generated in internal circuit 3 have on the emitter of transistor Q8.

As mentioned above, constant voltage $2V_F$ made by constant current source I and a serial circuit of diodes D1,D2 is applied to the base of transistor Q8 and also capacitor C1 cuts off direct current between VCO portion 1 and single buffer 2. Therefore, voltage variation of the power supply has a minimal effect on variation of the oscillation frequency of VCO portion 1. Moreover, the DC component of the spurious high frequency signals received from internal circuit 3 are cut off by capacitor C2 and resistor R7. Therefore, the spurious high frequency signals received from internal circuit 3 have a minimal effect on variation of the oscillation frequency. The above explanation is represented in the following formula:

$$V_{OUT} = R2/(R7+1/j\omega C2) \cdot V_{IN}$$

where, $V_{IN}$ stands for the high frequency signal voltage generated in PLL and $V_{OUT}$ stands for the voltage applied to the emitter of transistor Q8. As is known from this formula, if value $R7+1/j\omega C2$ is larger than the value of R2, the high frequency signal is eliminated by capacitor C2 and resistor R7. Accordingly, high frequency signal from internal circuit 3 has a minimal influence on the oscillation frequency.

Figure 9:
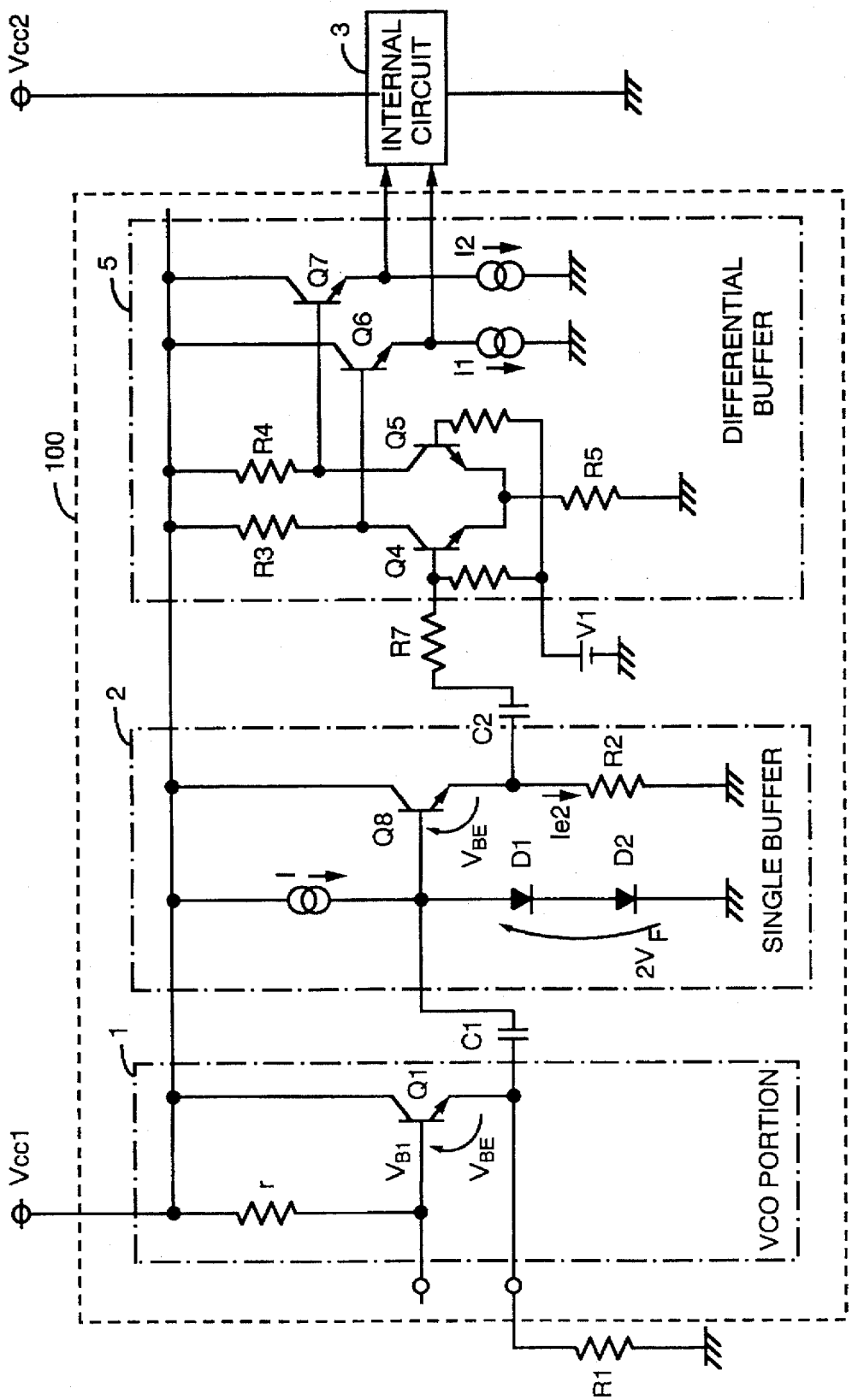
FIG. 9 shows another circuit configuration of a semiconductor IC used a synthesizer comprising an isolation circuit according to a seventh embodiment of the invention.

FIG. 9 shows another circuit configuration of a semiconductor IC used for a synthesizer comprising an isolation circuit according to a seventh embodiment of the invention. In FIG. 9, an IC chip 100 comprises a VCO portion 1, a single buffer 2 and a differential buffer 5. The single buffer 2 is an isolation circuit which separates VCO portion 1 from differential buffer 5. The circuit configuration of the seventh embodiment has an advantage that a differential buffer 5 is inserted between resistor 7 and internal circuit 3 to strengthen the isolation between single buffer 2 and VCO portion 1. Accordingly, in case of the circuit configuration of FIG. 9, the oscillation frequency is only minimally affected by the spurious high frequency signals from the internal circuit 3.

Embodiment 8

Figure 10:
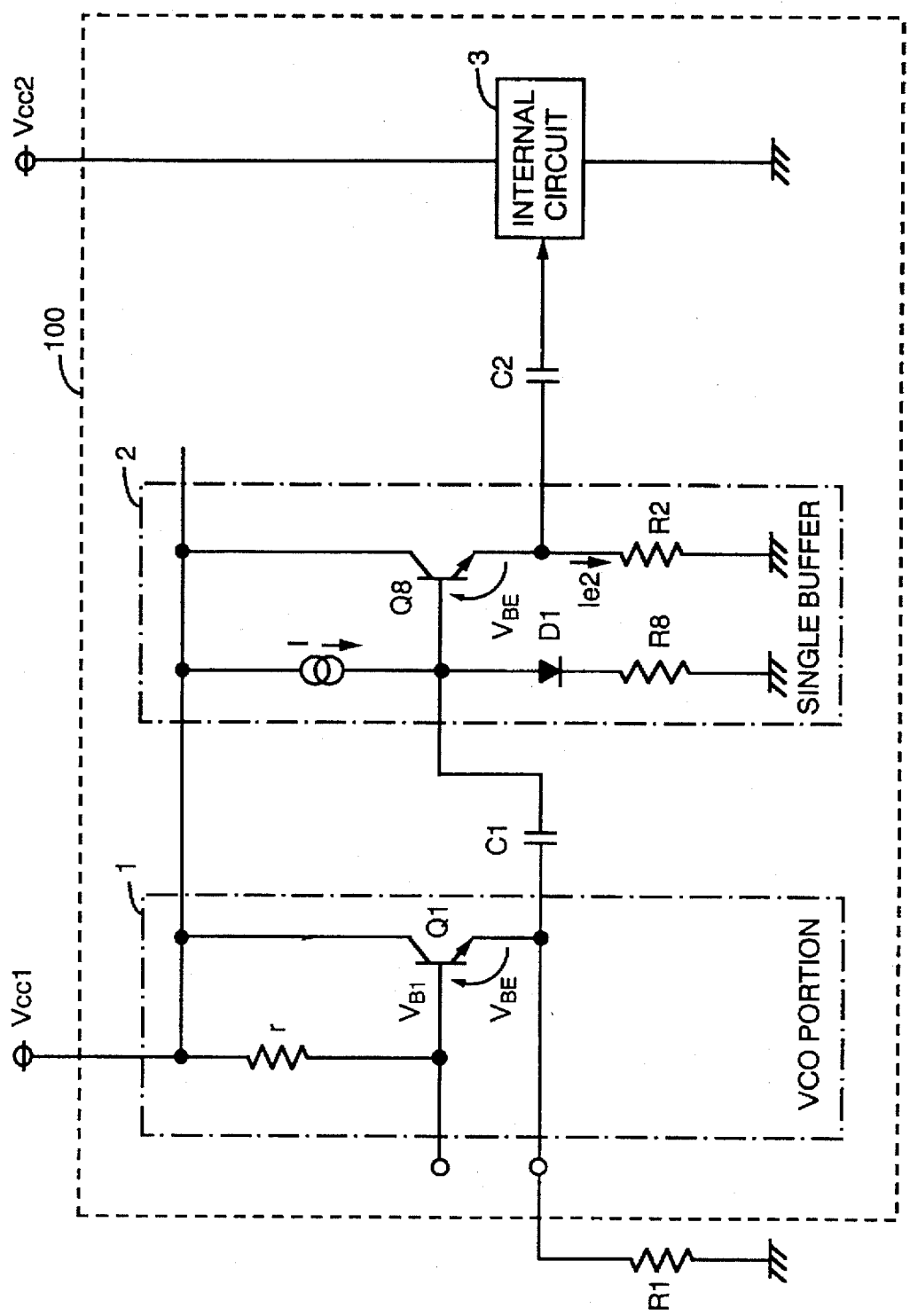
FIG. 10 shows a circuit configuration of a semiconductor IC used for a synthesizer comprising an isolation circuit according to an eighth embodiment of the invention.

FIG. 10 shows a circuit configuration of a semiconductor IC used for a synthesizer comprising an isolation circuit according to an eighth embodiment of the invention. Although FIG. 10 has a similar construction to that of the sixth embodiment, FIG. 10 is different in that a constant voltage generation portion is formed from diode D1 and resistor R8 compared with that of diodes D1, D2 in FIG. 6. In FIG. 10, since the base potential of transistor Q8 can be reduced, the IC circuit can operate in a low voltage state required for a mobile cellular phone. Other features are similar to those of the sixth embodiment.

In FIG. 10, it is also possible to strengthen the isolation between single buffer 2 and VCO portion 1 by inserting a differential buffer 5 between capacitor C2 and internal circuit 3. Accordingly, in case of the circuit configuration of FIG. 10, the oscillation frequency is only minimally affected by the spurious high frequency signals from the internal circuit 3 similar to the circuit of FIG. 7.

Embodiment 9

Figure 11:
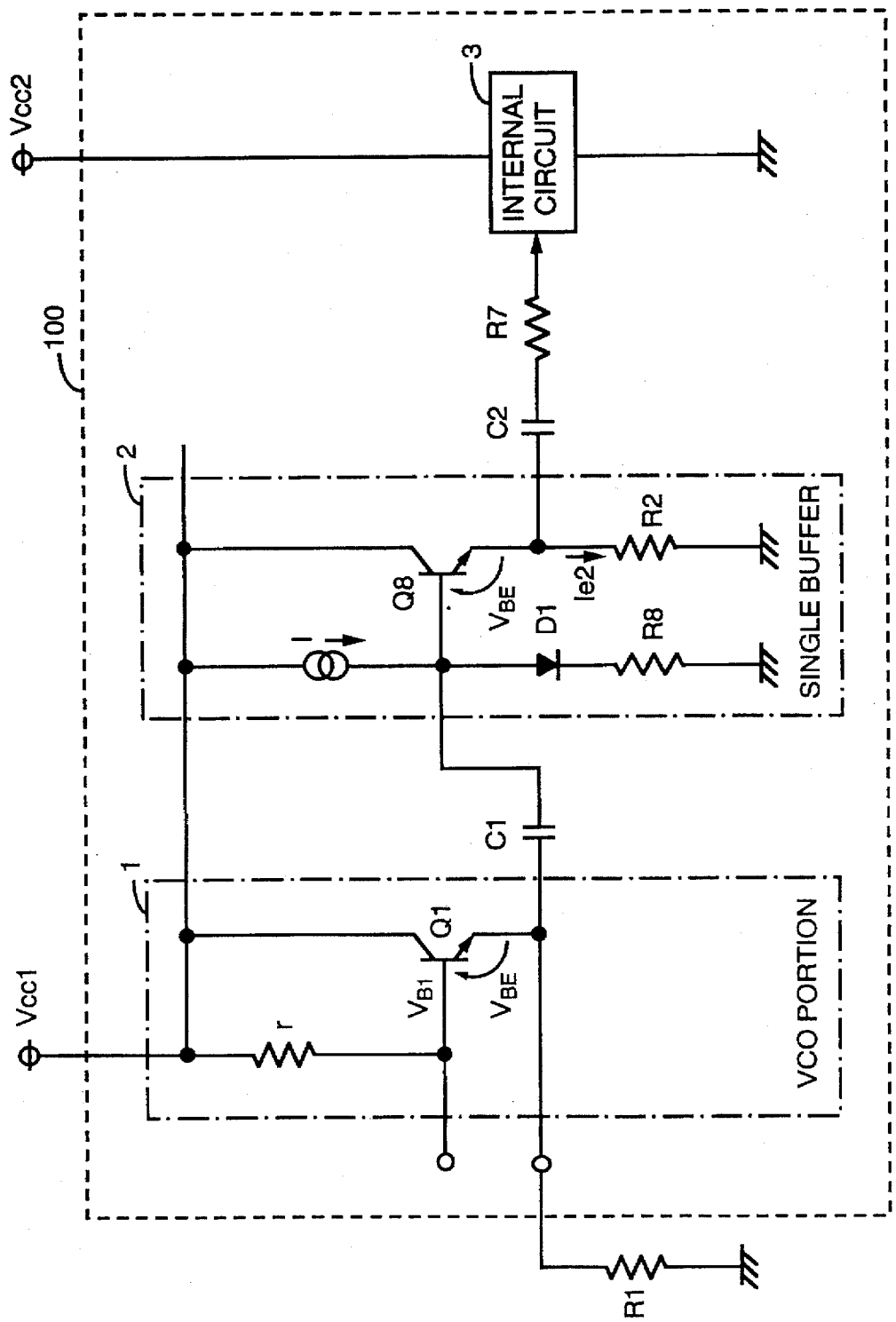
FIG. 11 shows a circuit configuration of a semiconductor IC used for a synthesizer comprising an isolation circuit according to a ninth embodiment of the invention.

FIG. 11 shows a circuit configuration of a semiconductor IC used for a synthesizer comprising an isolation circuit according to a ninth embodiment of the invention. Although FIG. 11 has a similar construction to that of the seventh embodiment, FIG. 11 is different in that a constant voltage generation portion comprises diode D1 and resistor R8 compared with that of diodes D1, D2 in FIG. 7. In FIG. 11, since the base potential of transistor Q8 can be reduced, the IC circuit can operate in a low voltage required for a mobile cellular phone. Other features are similar to those of the seventh embodiment.

In FIG. 11, it is also possible to strengthen the isolation between single buffer 2 and VCO portion 1 by inserting a differential buffer 5 between capacitor C2 and internal circuit 3. Accordingly, in case of the circuit configuration of FIG. 11, the oscillation frequency is only minimally affected by the high frequency signals from the internal circuit 3 similar to the circuit of FIG. 9.

Embodiment 10

Figure 12:
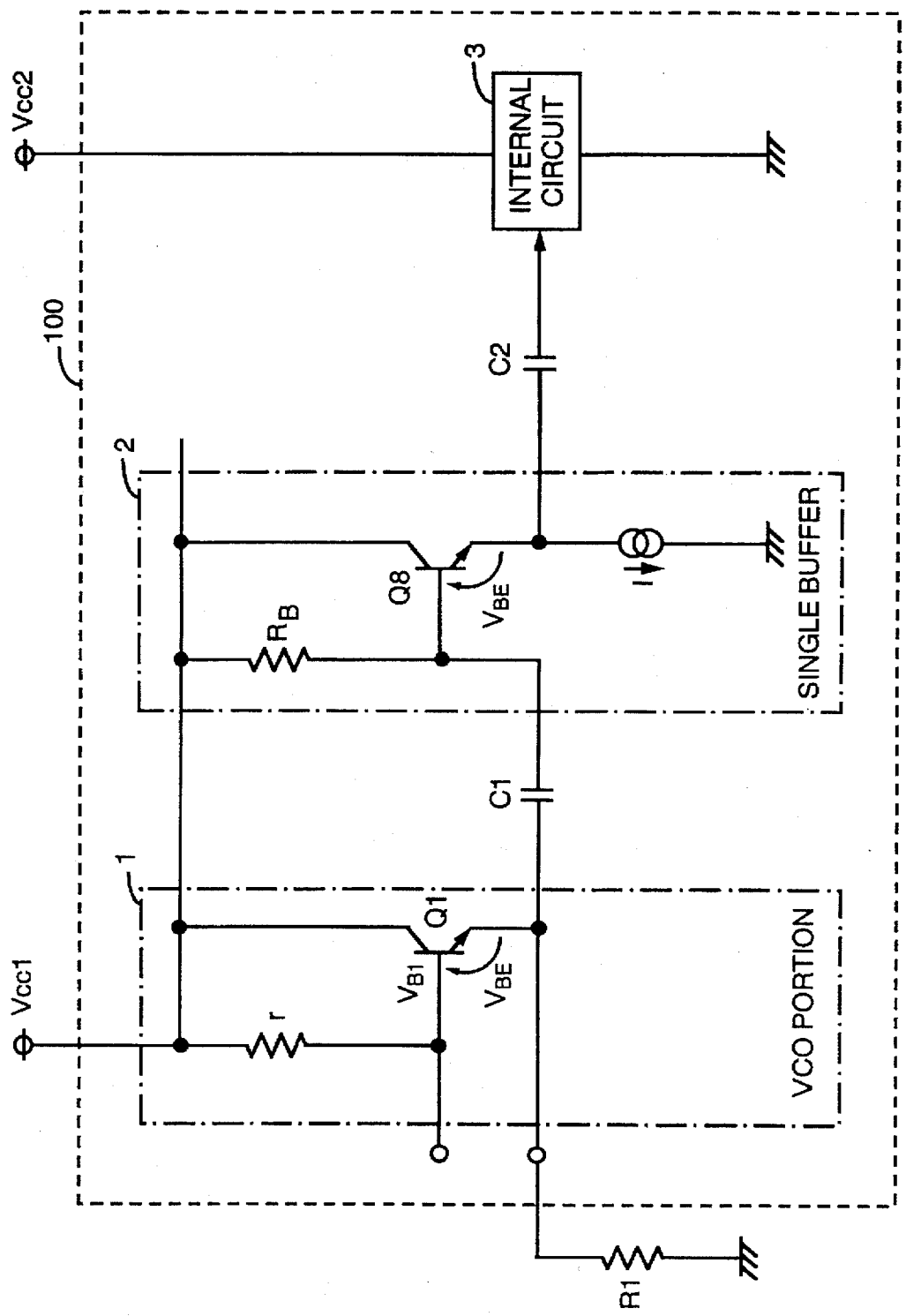
FIG. 12 shows a circuit configuration of a semiconductor IC used for a synthesizer comprising an isolation circuit according to a tenth embodiment of the invention.

FIG. 12 shows a circuit configuration of a semiconductor IC used for a synthesizer comprising an isolation circuit according to a tenth embodiment of the invention. FIG. 12, as is similar to the sixth embodiment in that it illustrates VCO portion 1, single buffer 2 and internal circuit 3 such as PLL. In FIG. 12, capacitors C1, C2 are similar to that of the sixth embodiment. However, in this embodiment, a bias voltage is supplied to the base of transistor Q8 from $V_{CC1}$ via resistor $R_B$ and a constant current source I is connected to the emitter of transistor Q8.

According to this circuit, capacitor C1 cuts off DC current between transistor Q1 and transistor Q8. Moreover, by driving transistor Q8 in single buffer 2 using constant current source I, variation of the base current of transistor Q8 can be reduced. DC components of the spurious high frequency signals from internal circuit 3 are cut off by capacitor C2 and attenuated by bypassing the constant current source I. Accordingly, the oscillation frequency is only minimally affected by the spurious high frequency signals from the internal circuit 3.

In FIG. 12, it is also possible to strengthen the isolation between single buffer 2 and VCO portion 1 by inserting a differential buffer 5 between capacitor C2 and internal circuit 3. Accordingly, in case of the circuit configuration of FIG. 12, the spurious high frequency signals from the internal circuit 3 have only a minimal effect on the oscillation frequency.

Embodiment 11

Figure 13:
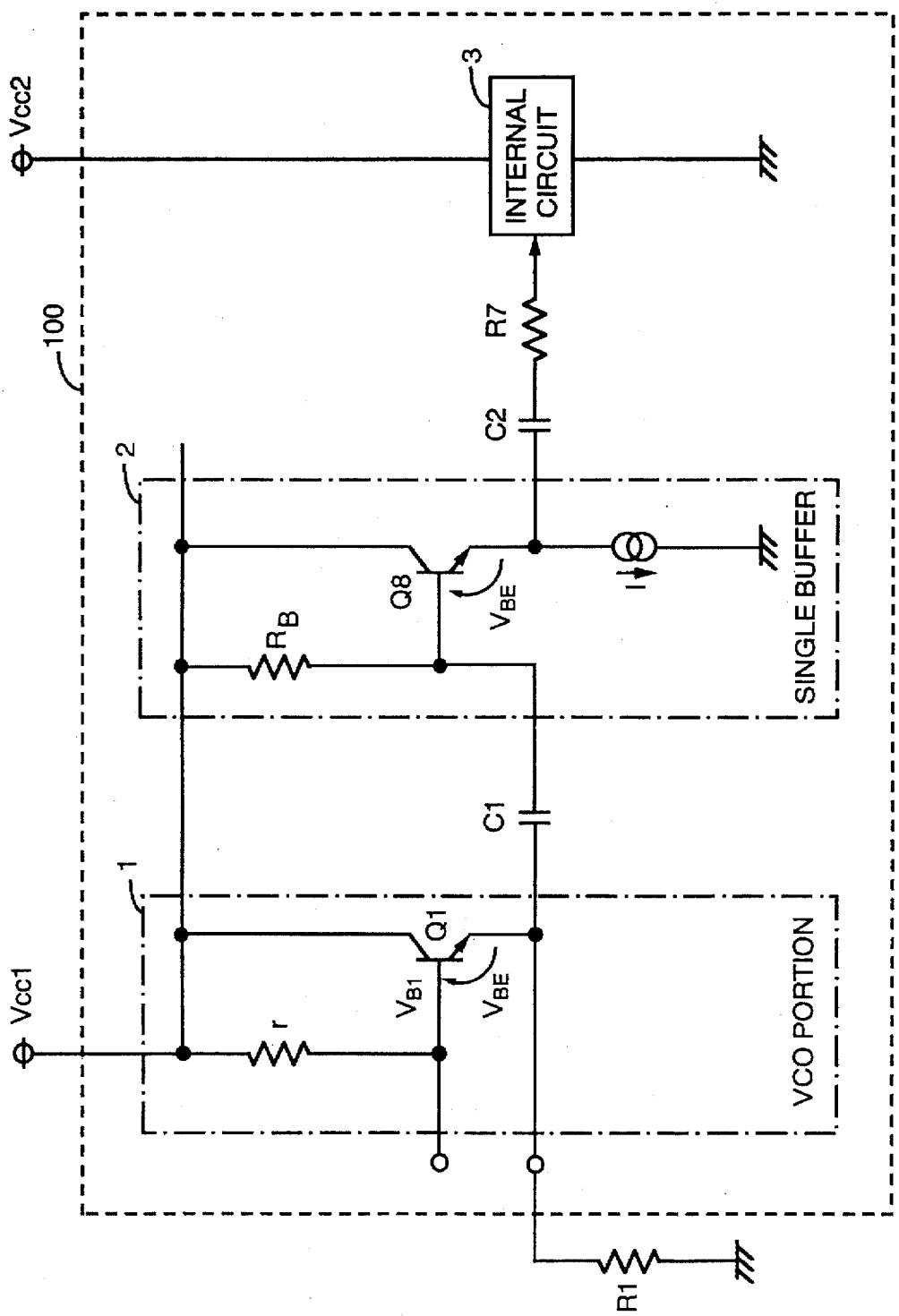
FIG. 13 shows a circuit configuration of a semiconductor IC used for a synthesizer comprising an isolation circuit according to an eleventh embodiment of the invention.

FIG. 13 shows a circuit configuration of a semiconductor IC used for a synthesizer comprising an isolation circuit according to an eleventh embodiment of the invention. FIG. 13, as is similar to the seventh embodiment, in that it includes VCO portion 1, single buffer 2 and internal circuit 3 such as PLL. In FIG. 13, capacitors C1, C2 and resistor R7 are similar to those of the seventh embodiment. In this embodiment, a bias voltage is supplied to the base of transistor Q8 from $V_{CC1}$ via resistor $R_B$ and a constant current source I is connected to the emitter of transistor Q8.

According to this circuit, capacitor C1 cuts off DC current between transistor Q1 and transistor Q8. Moreover, by driving transistor Q8 in single buffer 2 using constant current source I, variation of the base current of transistor Q8 can be reduced. DC components of the spurious high frequency signals from internal circuit 3 are cut off by capacitor C2 and the high frequency signals are attenuated by resistor R7 and capacitor C2. Accordingly, the oscillation frequency is only minimally affected by the spurious high frequency signals from the internal circuit 3.

In FIG. 13, it is also possible to strengthen the isolation between internal circuit 3 and VCO portion 1 by inserting a differential buffer 5 between capacitor C2 and internal circuit 3. Accordingly, in case of the circuit configuration of FIG. 13, the oscillation frequency is only minimally affected by the high frequency signal from the internal circuit 3 similar to the circuit of FIG. 9.

Embodiment 12

Figure 14:
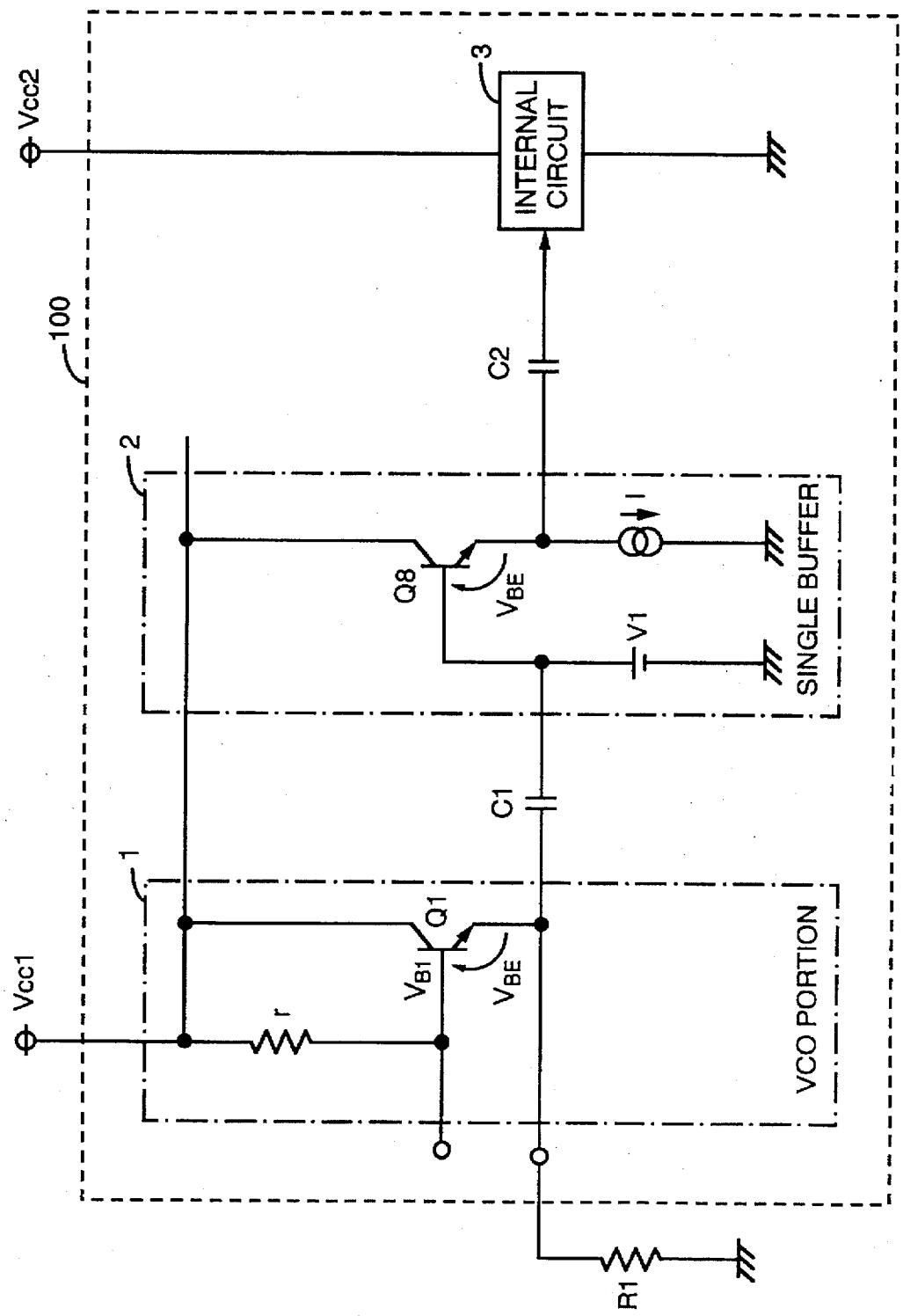
FIG. 14 shows a circuit configuration of a semiconductor IC used for a synthesizer comprising an isolation circuit according to a twelfth embodiment of the invention.

FIG. 14 shows a circuit configuration of a semiconductor IC used for a synthesizer comprising an isolation circuit according to a twelfth embodiment of the invention. FIG. 14, as is similar to the tenth embodiment, in that FIG. 14 depicts VCO portion 1, single buffer 2 and internal circuit 3 such as PLL. Capacitors C1,C2 are similar to those of the sixth embodiment. In this twelfth embodiment, a bias voltage is supplied to the base of transistor Q8 from constant voltage source V1 and a constant current source I is connected to the emitter of transistor Q8.

According to this circuit, capacitor C1 cuts off DC current between transistor Q1 and transistor Q8. Moreover, by driving transistor Q8 in single buffer 2 using constant voltage source V1, the potential of transistor Q8 becomes stable. Therefore, even if the current of transistor Q8 varies, the variation has a minimal effect on transistor Q8. Moreover, by driving transistor Q8 in single buffer 2 using constant current source I, variation of the base current of transistor Q8 can be reduced. DC components of the spurious high frequency signals from internal circuit 3 are cut off by capacitor C2 and the spurious high frequency signal is attenuated by causing the high frequency signal to pass through constant current source I. Accordingly, the oscillation frequency is only minimally affected by the spurious high frequency signals from the internal circuit 3.

In FIG. 14, it is also possible to strengthen the isolation between internal circuit 3 and VCO portion 1 by inserting a differential buffer 5 between capacitor C2 and internal circuit 3. Accordingly, in case of the circuit configuration of FIG. 14, the oscillation frequency is only minimally affected by the spurious high frequency signals from the internal circuit 3 similar to the circuit of FIG. 7.

Embodiment 13

Figure 15:
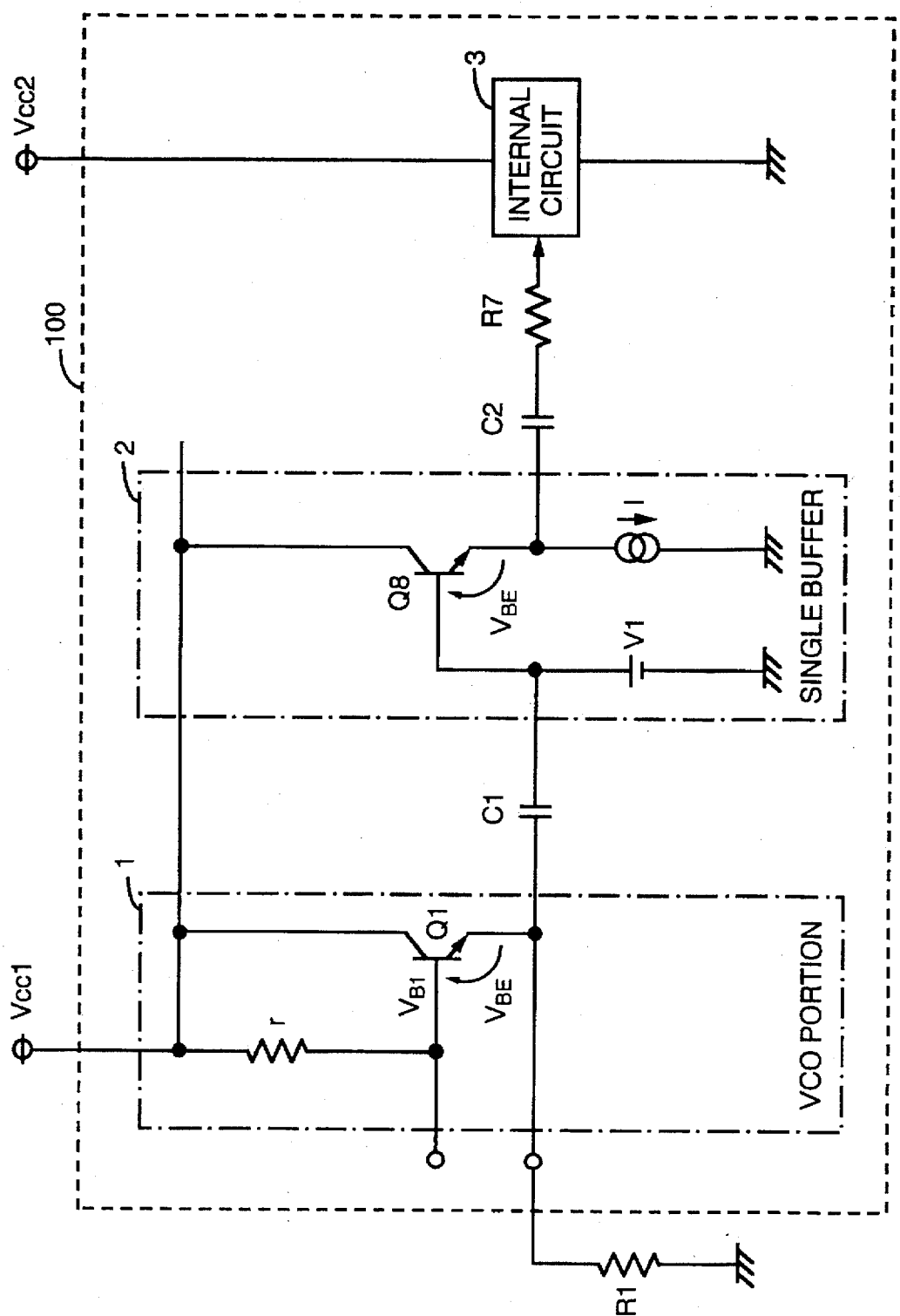
FIG. 15 shows a circuit configuration of a semiconductor IC used for a synthesizer comprising an isolation circuit according to a thirteenth embodiment of the invention.

FIG. 15 shows a circuit configuration of a semiconductor IC used for a synthesizer comprising an isolation circuit according to a thirteenth embodiment of the invention. FIG. 15, as is similar to the eleventh embodiment in that it shows VCO portion 1, single buffer 2, and internal circuit 3 such as PLL. In FIG. 15, capacitors C1, C2 and resistor R7 are similar to those of the eleventh embodiment. In this embodiment, a bias voltage is supplied to the base of transistor Q8 from constant voltage source V1 and a constant current source I is connected to the emitter of transistor Q8.

According to this circuit, capacitor C1 cuts off DC current between transistor Q1 and transistor Q8. Moreover, by driving transistor Q8 in single buffer 2 using constant voltage source V1, the potential of transistor Q8 becomes stable. Therefore, even if the current of transistor Q8 varies, the variation has only a minimal effect on the transistor Q8. Moreover, by driving transistor Q8 in single buffer 2 using constant current source I, variation of the base current of transistor Q8 can be reduced. DC components of the spurious high frequency signals from internal circuit 3 are cut off by capacitor C2 and the spurious high frequency signals are attenuated by resistor R7 and capacitor C2. Further, the spurious high frequency signals are attenuated by passing through constant current source I. Accordingly, the oscillation frequency is only minimally affected by the spurious high frequency signals from the internal circuit 3.

In FIG. 15, it is also possible to strengthen the isolation between internal circuit 3 and VCO portion 1 by inserting a differential buffer 5 between capacitor C2 and internal circuit 3. Accordingly, in case of the circuit configuration of FIG. 15, the oscillation frequency is only minimally affected by the spurious high frequency signals from the internal circuit 3 similar to the circuit of FIG. 9.

Embodiment 14

Figure 16:
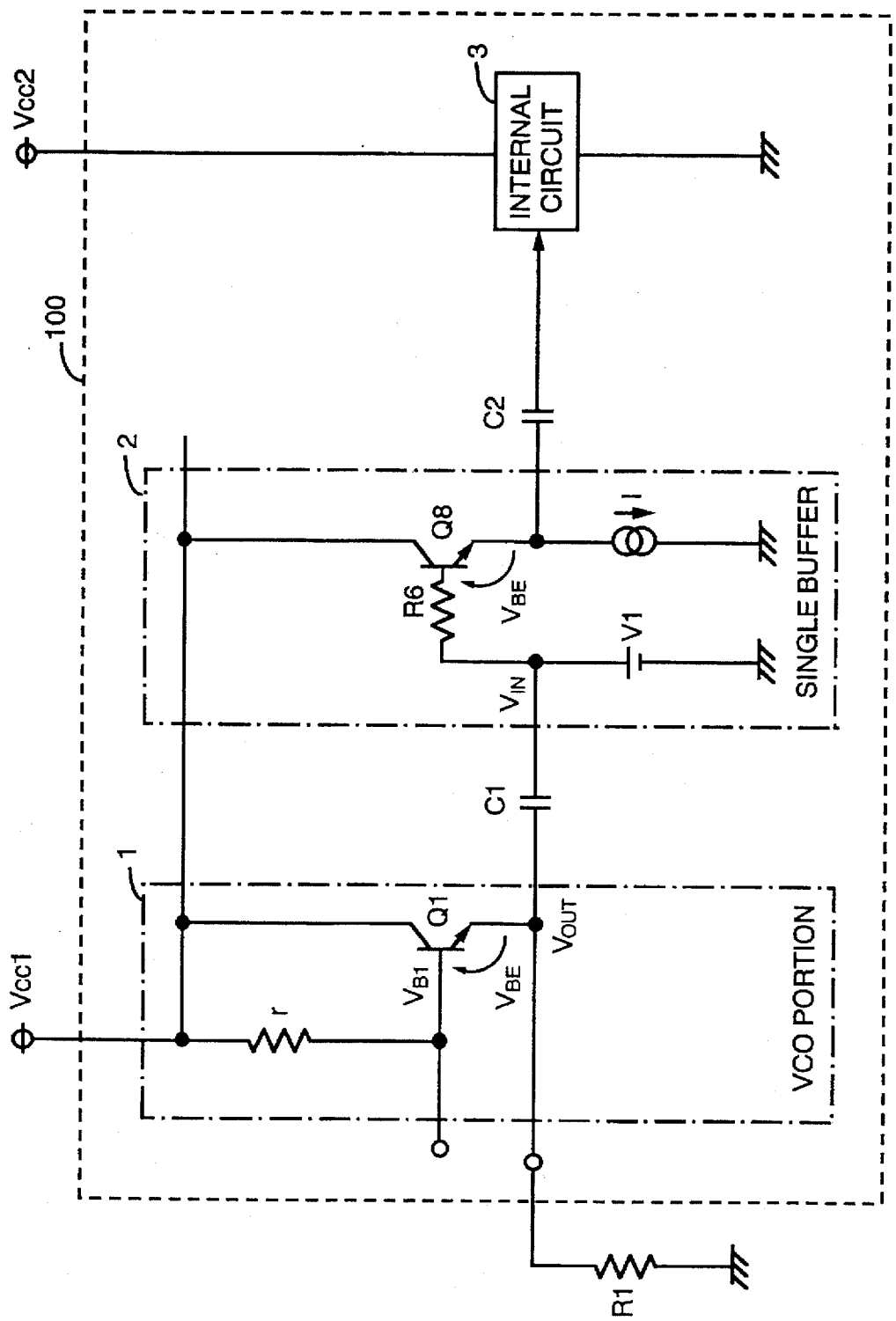
FIG. 16 shows a circuit configuration of a semiconductor IC used for a synthesizer comprising an isolation circuit according to a fourteenth embodiment of the invention.

FIG. 16 shows a circuit configuration of a semiconductor IC used for a synthesizer comprising an isolation circuit according to a fourteenth embodiment of the invention. FIG. 16, similar to the twelfth embodiment, comprises VCO portion 1, single buffer 2 and internal circuit 3 such as PLL. In FIG. 16, capacitors C1, C2 are similar to those of the twelfth embodiment. In this embodiment, a bias voltage is supplied to the base of transistor Q8 from constant voltage source v1 via resistor R6 having values of several tens–several hundreds Ω and a constant current source I is connected to the emitter of transistor Q8.

According to this circuit, capacitor C1 cuts off DC current between transistor Q1 and transistor Q8. Moreover, by driving transistor Q8 in single buffer 2 via resistor 6 using constant voltage source V1, the potential of transistor Q8 becomes stable. Therefore, even if the current of transistor Q8 varies, the variation has a minimal effect on transistor Q1, and then oscillation of transistor Q1 becomes stable. Similar to the explanation in the third embodiment, if voltage of the spurious high frequency components at the input base terminal of transistor Q8 which are generated and transferred from internal circuit 3 stands for $V_{IN}$ and voltage applied to the emitter of transistor Q1 stands for $V_{OUT}$, voltage of the spurious high frequency components which influence the emitter of transistor Q3 in VCO portion 1 via capacitor C1 and resistor R6 is represented by the following formula:

$$V_{OUT} = \{R1/(R1+R6+1/j\omega C1)\} \cdot V_{IN}.$$

By taking the sum of the impedance value $1/j\omega C1$ and the resistance value of resistor R6 to be larger than the resistance value of resistor R1, it is further possible to attenuate the voltage applied to transistor Q1 in VCO portion 1. Accordingly, the spurious high frequency components are more attenuated than those of the twelfth embodiment, which diminishes their effect on VCO portion 1.

Moreover, by driving transistor Q8 in single buffer 2 using constant current source I, variation of the base current of transistor Q8 can be reduced. DC components of the spurious high frequency signals from internal circuit 3 are cut off by capacitor C2 and the spurious high frequency signals are attenuated by passing through constant current source I. Accordingly, the oscillation frequency has a minimal effect on the spurious high frequency signals from the internal circuit 3.

By the above-mentioned circuit configuration, isolation of VCO portion 1 and that of internal circuit 3 are further strengthened, which further stabilizes oscillation frequency characteristics (C/N, S/N) of transistor Q1.

In FIG. 16, it is also possible to strengthen the isolation between internal circuit 3 and VCO portion 1 by inserting a differential buffer 5 between capacitor C2 and internal circuit 3. Accordingly, in case of the circuit configuration of FIG. 16, the oscillation frequency is minimally affected by the spurious high frequency signals from the internal circuit 3 similar to the circuit of FIG. 7.

Embodiment 15

Figure 17:
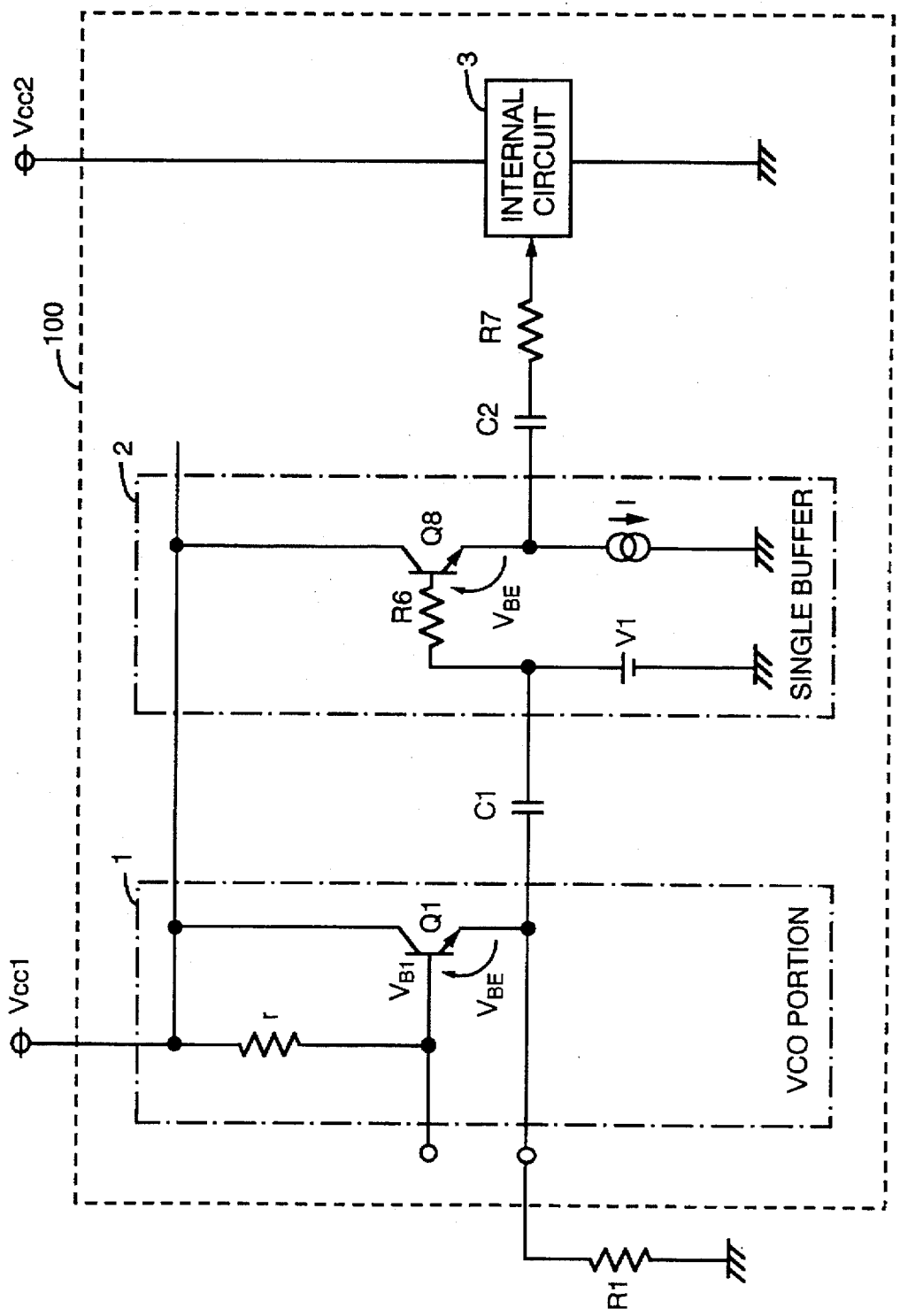
FIG. 17 shows a circuit configuration of a semiconductor IC used for a synthesizer comprising an isolation circuit according to a fifteenth embodiment of the invention.
Figure 18:
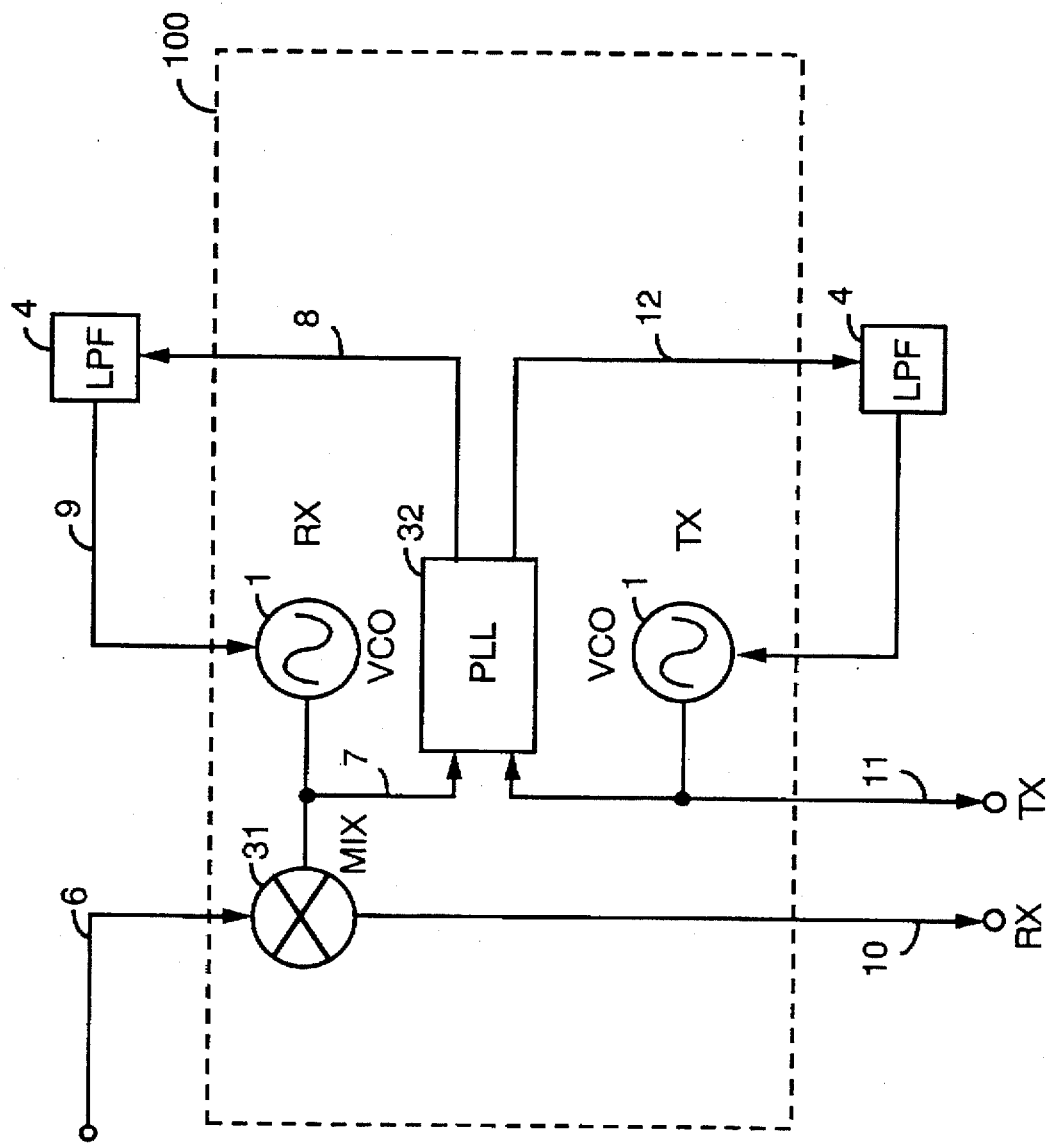
FIG. 18 shows a system of the synthesizer of the invention, where a VCO portion, an internal circuit such as PLL, and a MIX are all disposed on a single substrate.
Figure 19:
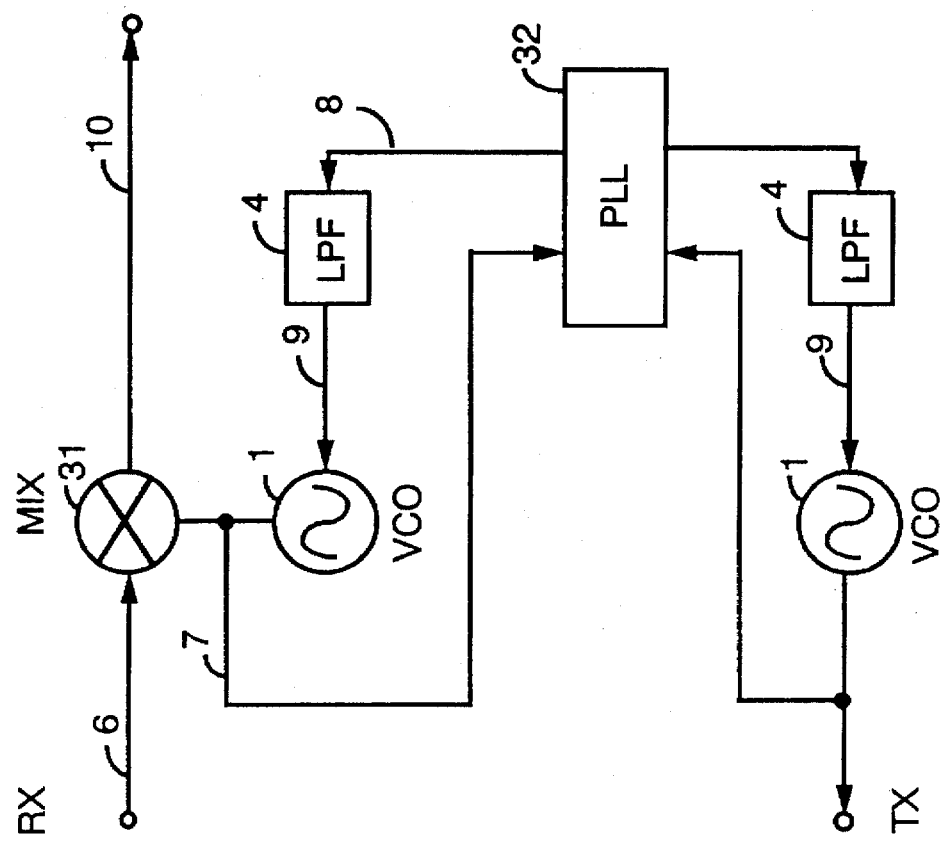
FIG. 19 shows a conventional synthesizer system formed by interconnecting VCO, MIX and PLL, which are formed on the separate substrates.
Figure 20:
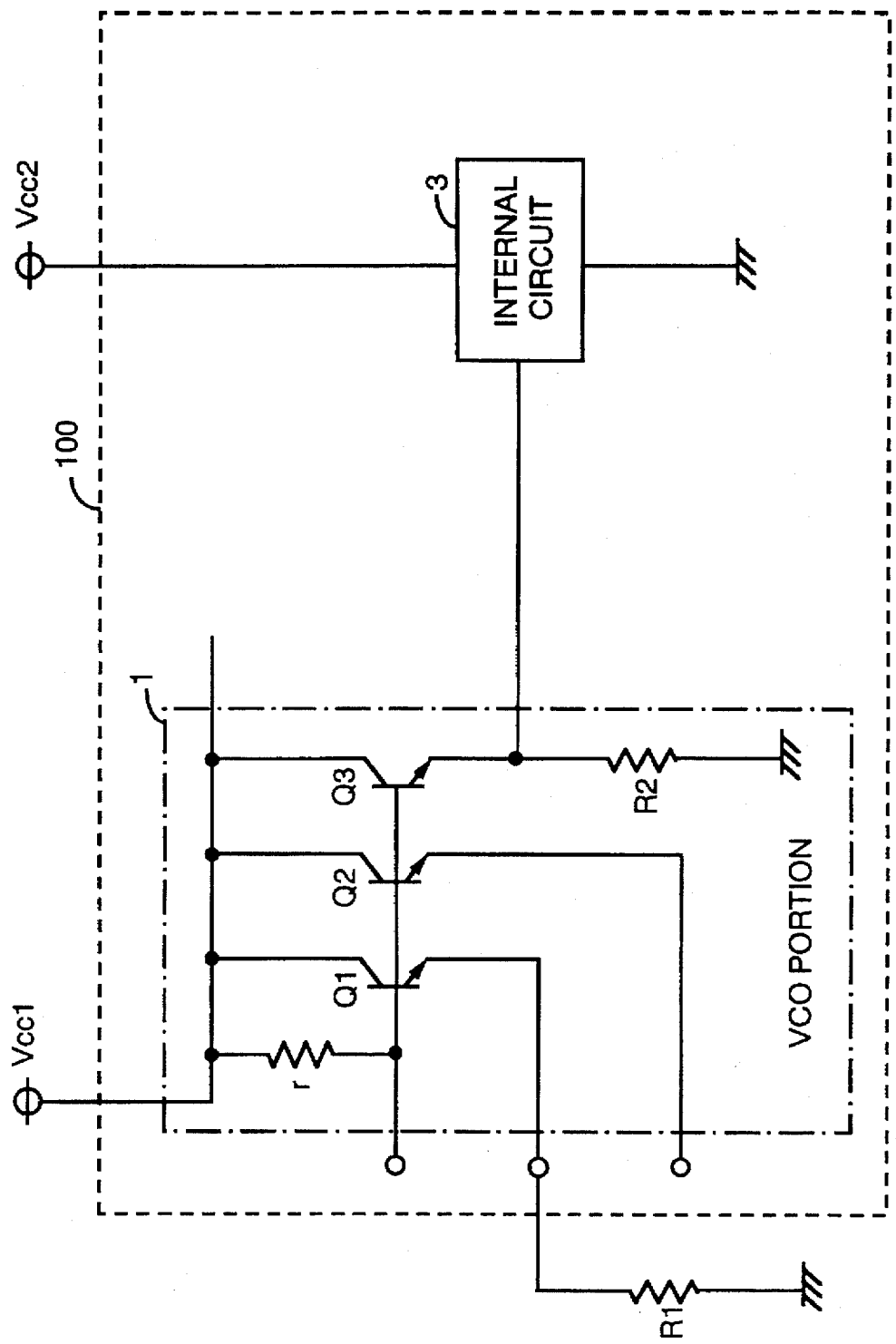
FIG. 20 illustrates another conventional circuit configuration which comprises a VCO portion and other internal circuits such as PLL and a MIX formed on a single substrate.
Figure 21:
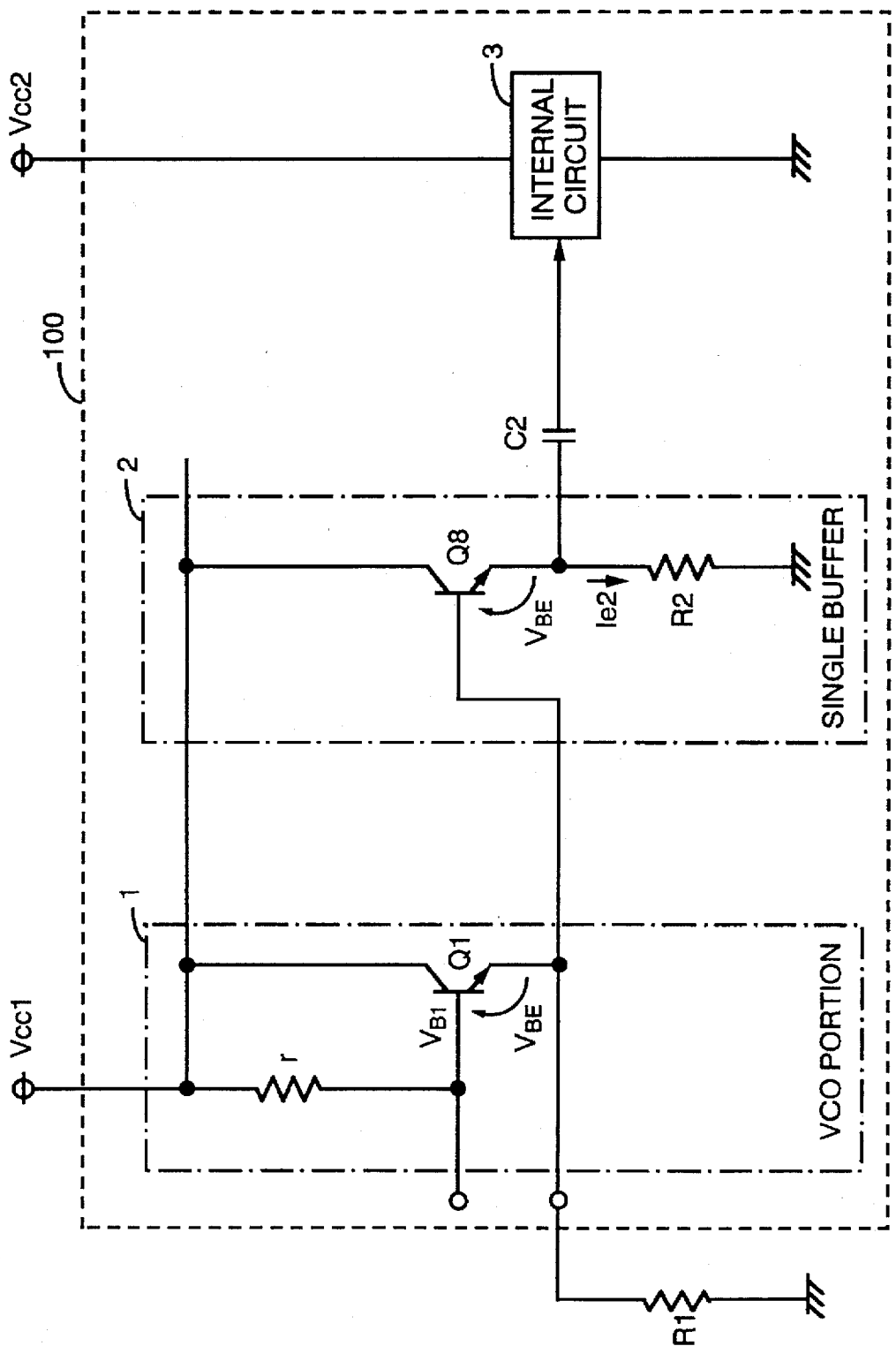
FIG. 21 shows a conventional circuit configuration which comprises a VCO portion and an internal circuit such as PLL formed on a single substrate.

FIG. 17 shows a circuit configuration of a semiconductor IC used for a synthesizer comprising an isolation circuit according to a fifteenth embodiment of the invention. FIG. 16, similar to the thirteenth embodiment, comprises VCO portion 1, single buffer 2 and internal circuit 3 such as PLL. In FIG. 17, capacitors C1, C2 are similar to those of the thirteenth embodiment. In this embodiment, a bias voltage is supplied to the base of transistor Q8 from constant voltage source V1 via resistor R6 having values of several tens–several hundreds Ω and a constant current source I is connected to the emitter of transistor Q8.

According to this circuit, capacitor C1 cuts off DC current between transistor Q1 and transistor Q8. Moreover, by driving transistor Q8 in single buffer 2 via resistor 6 by constant voltage source V1, the potential of transistor Q8 becomes stable. Therefore, even if the current of transistor Q8 varies, the variation has little effect on transistor Q1, and then oscillation of transistor Q1 becomes stable. Since the operation and effects after inserting resistor R6 are similar to the fourteenth embodiment, the detailed explanation is omitted.

In FIG. 17, as is shown in FIG. 9, it is also possible to strengthen the isolation between internal circuit 3 and VCO portion 1 by inserting a differential buffer 5 between resistor R7 and internal circuit 3. Accordingly, in case of the circuit configuration of FIG. 17, the oscillation frequency has a minimal effect on the high frequency signal from the internal circuit 3 similar to the circuit of FIG. 9.

What is claimed is:

1. A semiconductor IC comprising:
   a substrate;
   a VCO portion disposed on said substrate, said VCO portion including first, second, and third transistors, each transistor having an emitter, a collector, and a base wherein the emitter of the first transistor is connected to the base of the second and third transistors;
   an internal circuit disposed on said substrate; and
   a capacitor coupled between said VCO portion and said internal circuit to cut off direct current between the VCO portion and the internal circuit.

2. A semiconductor IC comprising:
   a substrate;
   a VCO portion disposed on said substrate;
   an internal circuit disposed on said substrate;
   a differential buffer circuit connected to said internal circuit and arranged on said substrate to cut off direct current between said VCO portion and said internal circuit;
   a capacitor having a first terminal connected to said VCO portion and a second terminal connected to said differential buffer; and
   a constant voltage source connected to said differential buffer circuit.

3. A semiconductor IC comprising:
   a substrate;
   a VCO portion disposed on said substrate, said VCO portion having an input and an output;
   an internal circuit disposed on said substrate;
   a differential buffer circuit having an input and an output, said differential buffer circuit being arranged on said substrate to cut off direct current between said VCO portion and said internal circuit;
   a series circuit of a resistor and a capacitor, a first end of said series circuit being connected to the output of said VCO portion, and a second end of said series circuit being connected to the input of said differential buffer circuit; and
   a constant voltage source connected to the input of said differential buffer.

4. The semiconductor IC of claim 2 wherein said differential buffer includes a differential amplifier having first and second transistors and an emitter follower output circuit including first and second output transistors, the first transistor of the differential amplifier being coupled with said VCO portion;
   wherein said constant voltage source is connected to respective bases of the first and second transistors of the differential amplifier; and
   wherein respective collectors of the first and second transistors of the differential amplifier are connected to corresponding bases of the first and second output transistors, respectively; and
   further comprising first and second constant current sources, the first and second constant current sources being connected to emitters of the first and second output transistors, respectively.

5. The semiconductor IC of claim 3 wherein said differential buffer includes a differential amplifier having first and second transistors and an emitter follower output circuit including first and second output transistors, the first transistor of the differential amplifier being coupled with said VCO portion;
   wherein said constant voltage source is connected to respective bases of the first and second transistors of the differential amplifier; and
   wherein respective collectors of the first and second transistors of the differential amplifier are connected to corresponding bases of the first and second output transistors, respectively and further comprising first and second constant current sources, the first and second constant current sources being connected to emitters of the first and second output transistors, respectively.

6. The semiconductor IC of claim 2 further comprising:
   means for receiving power from a first power supply and for transmitting the received power to said VCO portion; and
   means for receiving power from a second power supply and for transmitting the received power to said differential buffer circuit.

7. The semiconductor IC of claim 3 further comprising:
   means for receiving power from a first power supply and for transmitting the received power to said VCO portion; and
   means for receiving power from a second power supply and for transmitting the received power to said differential buffer circuit.

8. A semiconductor IC on a silicon wafer chip comprising:
   a VCO portion;
   a single buffer;
   a first capacitor connected to said VCO portion and to said single buffer to cut off direct current flow between said VCO and said single buffer;
   a differential buffer;
   an internal circuit connected to said differential buffer; and
   a second capacitor having a first terminal connected to said single buffer and a second terminal connected to said differential buffer.

9. A semiconductor IC on a silicon wafer chip comprising:
   a VCO portion;
   a single buffer;
   a first capacitor connected to said VCO portion and to said single buffer to cut off direct current flow between said VCO and said single buffer;
   an internal circuit; and
   a series circuit of a second capacitor and a resistor connected to said single buffer and said internal circuit for separating said single buffer from said internal circuit.

10. A semiconductor IC on a silicon wafer chip comprising:
    a first capacitor connected to a VCO portion and to a single buffer to cut off direct current flow between said VCO and said single buffer;
    a differential buffer;
    an internal circuit connected to said differential buffer; and
    a series circuit of a second capacitor and a resistor connected to said differential buffer and to said internal circuit.

11. The semiconductor IC of claim 8 wherein said single buffer includes a buffer transistor having a base connected to a constant current source and to a plurality of diodes, said buffer transistor having an emitter connected to a grounded resistor.

12. The semiconductor IC of claim 9 wherein said single buffer includes a buffer transistor having a base connected to a constant current source and to a plurality of diodes, said buffer transistor having an emitter connected to a grounded resistor.

13. The semiconductor IC of claim 10 wherein said single buffer includes a buffer transistor having a base connected to a constant current source and to a plurality of diodes, said buffer transistor having an emitter connected to a grounded resistor.

14. The semiconductor IC of claim 8 wherein said single buffer includes a buffer transistor having a base connected to a constant current source and to a series circuit of a plurality of diodes and a resistor, said buffer transistor having an emitter connected to a grounded resistor.

15. The semiconductor IC of claim 9 wherein said single buffer includes a buffer transistor having a base connected to a constant current source and to a series circuit of a plurality of diodes and a resistor, said buffer transistor having an emitter connected to a grounded resistor.

16. The semiconductor IC of claim 10 wherein said single buffer includes a buffer transistor having a base connected to a constant current source and to a series circuit of a plurality of diodes and a resistor, said buffer transistor having an emitter connected to a grounded resistor.

17. A semiconductor IC having a VCO portion, a single buffer, and an internal circuit on a silicon wafer chip comprising:
   a first capacitor interconnecting said VCO portion and said single buffer to cut off direct current between said VCO portion and said single buffer; and
   a second capacitor interconnecting the internal circuit and said single buffer to cut off direct current between said single buffer and said internal circuit;
   said single buffer including a buffer transistor having a base connected to a resistor, the buffer transistor having an emitter connected to a grounded constant current source.

18. A semiconductor IC having a VCO portion, a single buffer, and an internal circuit on a silicon wafer chip comprising:
   a first capacitor interconnecting the VCO portion and the single buffer to cut off direct current between the VCO portion and the single buffer; and
   a series circuit of a second capacitor and a resistor, the series circuit interconnecting the single buffer and the internal circuit for separating the single buffer from the internal circuit;
   said single buffer including a buffer transistor having a base connected to a resistor, the buffer transistor having an emitter connected to a grounded constant current source.

19. A semiconductor IC having a VCO portion, a single buffer, and an internal circuit on a silicon wafer chip comprising:
   a first capacitor interconnecting the VCO portion and the single buffer to cut off direct current between the VCO portion and the single buffer; and
   a second capacitor interconnecting the single buffer with the internal circuit to cut off direct current between the single buffer and the internal circuit;
   said single buffer including a buffer transistor having a base connected to a constant voltage source (V1), and having an emitter connected to a grounded constant current source.

20. A semiconductor IC having a VCO portion, a single buffer, and an internal circuit on a silicon wafer chip comprising:
   a first capacitor interconnecting the VCO portion and the single buffer to cut off direct current between the VCO portion and the single buffer; and
   a series circuit of a second capacitor and a resistor interconnecting the single buffer and the internal circuit to separate the single buffer from the internal circuit;
   said single buffer including a buffer transistor having a base connected to a constant voltage source and having an emitter connected to a grounded a constant current source.

21. A semiconductor IC having a VCO portion, a single buffer, and an internal circuit on a silicon wafer chip comprising:
   a series circuit of a first capacitor and a resistor, said series circuit interconnecting the VCO portion and the differential buffer to separate the VCO portion from the single buffer;
   a second capacitor interconnecting the single buffer and the internal circuit to cut off direct current between the single buffer and the internal circuit; and
   a constant voltage source connected to a node of the first capacitor and the resistor;
   said single buffer including a buffer transistor having an emitter connected to a grounded constant current source.

22. A semiconductor IC having a VCO portion, a single buffer, and an internal circuit on a silicon wafer chip comprising:
   a series circuit of a first capacitor and a resistor, the capacitor and the resistor being connected at a node, the series circuit interconnecting the single buffer and the VCO portion to separate the VCO portion from the single buffer;
   a series circuit of a second capacitor and a resistor interconnecting the single buffer and the internal circuit to separate the single buffer from the internal circuit; and
   a constant voltage source connected to the node;
   said single buffer including a buffer transistor having an emitter connected to a grounded constant current source.

23. The semiconductor IC of claim 17 further comprising a differential buffer having a first terminal connected to said second capacitor and a second terminal connected to said internal circuit.

24. The semiconductor IC of claim 19 further comprising a differential buffer having a first terminal connected to said second capacitor and a second terminal connected to said internal circuit.

25. The semiconductor IC of claim 21 further comprising a differential buffer having a first terminal connected to said second capacitor and a second terminal connected to said internal circuit.

26. The semiconductor IC of claim 18 further comprising a differential buffer having a first terminal connected to the resistor of said series circuit and a second terminal connected to said internal circuit.

27. The semiconductor IC of claim 20 further comprising a differential buffer having a first terminal connected to said resistor and a second terminal connected to said internal circuit.

28. The semiconductor IC of claim 22 further comprising a differential buffer having a first terminal connected to said resistor and a second terminal connected to said internal circuit.

29. A semiconductor IC comprising:

a substrate;

a VCO portion disposed on said substrate;

a single buffer disposed on said substrate and including a buffer transistor having a base connected to a constant current source and to a plurality of diodes, said buffer transistor having an emitter connected to a grounded resistor;

an internal circuit disposed on said substrate;

a first capacitor connected to said VCO portion and to said single buffer; and a second capacitor connected to said single buffer and to said internal circuit such that a signal path is formed from said VCO portion to said internal circuit, said first capacitor being arranged on said substrate to cut off direct current between said VCO portion and said single buffer, said second capacitor being arranged on said substrate to attenuate feedback signals from said internal circuit.

30. A semiconductor IC comprising:

a substrate;

a VCO portion disposed on said substrate;

a single buffer disposed on said substrate and including a buffer transistor having a base connected to a constant current source and to a series circuit of a plurality of diodes and a resistor, said buffer transistor having an emitter connected to a grounded resistor;

an internal circuit disposed on said substrate;

a first capacitor connected to said VCO portion and to said single buffer; and a second capacitor connected to said single buffer and to said internal circuit such that a signal path is formed from said VCO portion to said internal circuit, said first capacitor being arranged on said substrate to cut off direct current between said VCO portion and said single buffer, said second capacitor being arranged on said substrate to attenuate feedback signals from said internal circuit.

* * * * *